US012713746B2

(12) United States Patent
Lee et al.

(10) Patent No.: US 12,713,746 B2
(45) Date of Patent: Aug. 18, 2026

(54) WIRING SUBSTRATE AND DISPLAY DEVICE INCLUDING THE SAME

(71) Applicant: Samsung Display Co., LTD., Yongin-si (KR)

(72) Inventors: Dong Min Lee, Anyang-si (KR); Hyun Ah Sung, Suwon-si (KR); Young Rok Kim, Anyang-si (KR); Joon Yong Park, Gunpo-si (KR); Hyun Eok Shin, Gwacheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 703 days.

(21) Appl. No.: 18/088,919

(22) Filed: Dec. 27, 2022

(65) Prior Publication Data

US 2023/0317902 A1 Oct. 5, 2023

(30) Foreign Application Priority Data

Apr. 1, 2022 (KR) ........................ 10-2022-0041385

(51) Int. Cl.
*H10H 20/857* (2025.01)
*H10H 20/831* (2025.01)

(52) U.S. Cl.
CPC ...... *H10H 20/857* (2025.01); *H10H 20/8316* (2025.01)

(58) Field of Classification Search
CPC ............. H10H 20/857; H10H 20/8316; H10H 20/0364; H10H 20/83; H10H 20/819; H10H 20/84; H10H 29/142; H10H 29/49; H10H 29/857; H10H 29/922; H10H 29/942; H10D 86/441; H10D 86/60; H10D 86/451; H10K 59/1315; H01L 25/167; H01L 25/0753; H01L 25/00
See application file for complete search history.

(56) References Cited

U.S. PATENT DOCUMENTS

| | | | |
|---|---|---|---|
| 7,202,143 B1 | 4/2007 | Naseem et al. | |
| 2014/0197382 A1 | 7/2014 | Kim et al. | |
| 2018/0083211 A1 * | 3/2018 | Lee | H10K 50/844 |
| 2020/0356142 A1 | 11/2020 | Wang | |
| 2021/0335986 A1 | 10/2021 | Jeon et al. | |
| 2022/0406817 A1 * | 12/2022 | Park | H10H 20/84 |

FOREIGN PATENT DOCUMENTS

| | | |
|---|---|---|
| KR | 10-2021-0124564 | 10/2021 |

OTHER PUBLICATIONS

Korean Notice of Allowance issued in corresponding KR Application No. 10-2022-0041385, dated Mar. 13, 2026, 2 pages.

* cited by examiner

*Primary Examiner* — Latanya N Crawford Eason
(74) *Attorney, Agent, or Firm* — Womble Bond Dickinson (US) LLP

(57) ABSTRACT

A wiring substrate and a display device including the same are provided. The display device comprises a first substrate comprising a display area and a pad area disposed on one side of the display area, and a plurality of conductive layers comprising a plurality of wires and conductive patterns disposed in the display area and the pad area on the first substrate, wherein at least one of the conductive layers comprises a copper-indium alloy and comprises a metal layer having a grain size of 140 nm or less.

20 Claims, 30 Drawing Sheets

FIG. 6

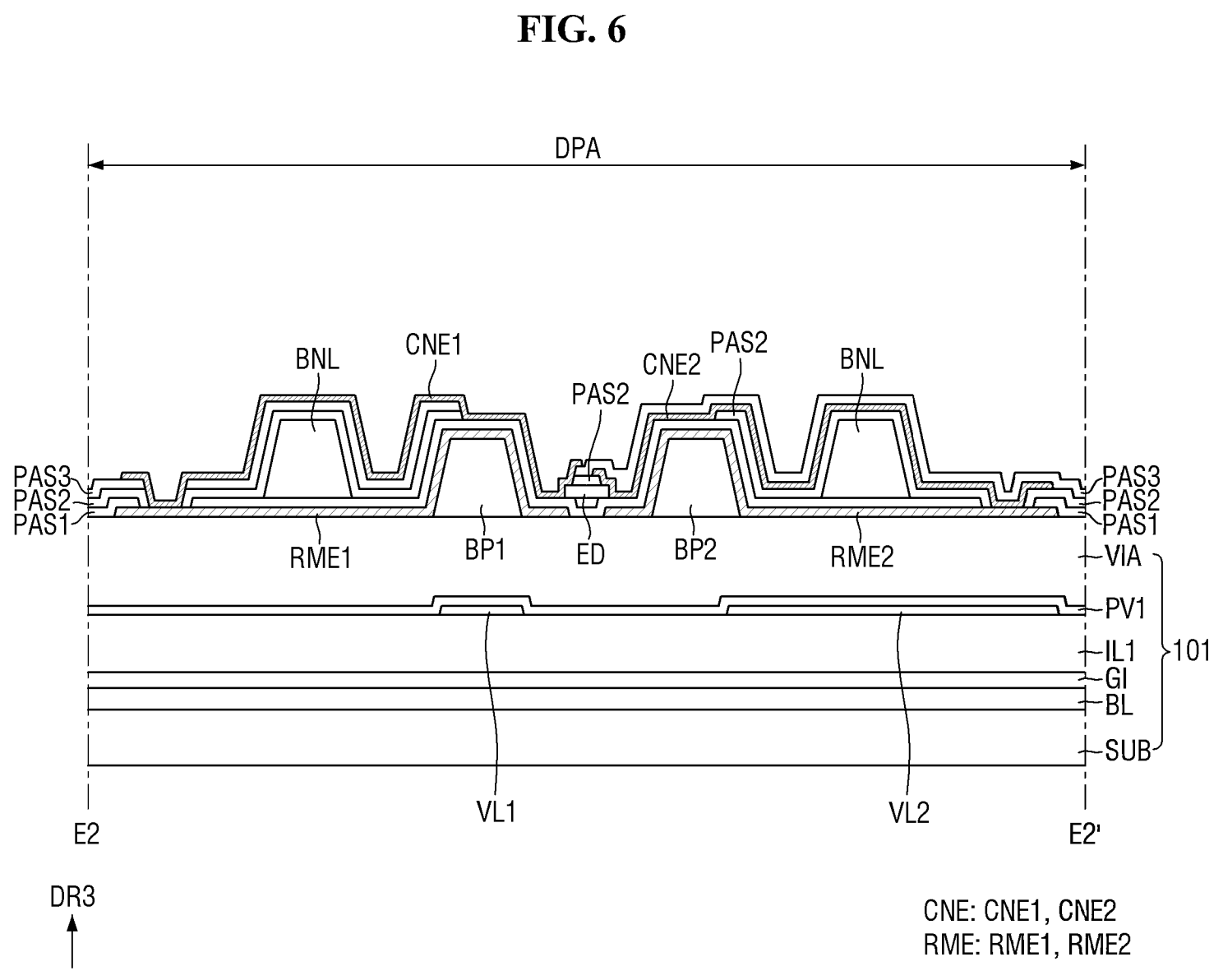

DPA
PAS3
PAS2
PAS1
VIA
PV1
IL1
GI
BL
SUB
101
E2
E2'
BNL
CNE1
RME1
BP1
VL1
PAS2
ED
CNE2
BP2
RME2
VL2
DR3

CNE: CNE1, CNE2
RME: RME1, RME2

FIG. 16

DPA
CNE1
CNE2
PAS2
PAS3
PAS2
BNL
PAS1
CTD
RME1
BP1
ED
BP2
RME2
CTS
VIA
PV1
IL1
GI
BL
SUB
101
CDP1
BML
S1 G1 ACT1 D1
T1
VL1
CDP2
S2 G2 ACT2 D2
T2
CDP4
VL1
DR3
CNE: CNE1, CNE2
RME: RME1, RME2

WIRING SUBSTRATE AND DISPLAY DEVICE INCLUDING THE SAME

CROSS-REFERENCE TO RELATED APPLICATION(S)

This application claims priority to and benefits of Korean Patent Application No. 10-2022-0041385 under 35 U.S.C. § 119, filed on Apr. 1, 2022, in the Korean Intellectual Property Office, the entire contents of which are incorporated herein by reference.

BACKGROUND

1. Technical Field

The disclosure relates to a wiring substrate and a display device including the same.

2. Description of the Related Art

The importance of display devices has steadily increased with the development of multimedia technology. In response thereto, various types of display devices such as an organic light emitting display (OLED), a liquid crystal display (LCD) and the like have been used.

As a device for displaying an image of a display device, there is a self-light emitting display device including a light emitting element. The self-light emitting display device includes an organic light emitting display device using an organic material as a light emitting material as a light emitting element, an inorganic light emitting display device using an inorganic material as a light emitting material, or the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a wiring substrate in which a wire has a smooth surface and improved straightness, and a display device including the same.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, a display device may include a display area and a pad area disposed on a side of the display area, and conductive layers which may include wires and conductive patterns disposed in the display area and the pad area on a substrate, wherein at least one of the conductive layers may include a copper-indium alloy and may include a metal layer having a grain size equal to or less than about 140 nm.

In an embodiment, the metal layer may have a resistivity equal to or less than about 2.3 μΩcm.

In an embodiment, the metal layer may have an indium content equal to or less than about 1 at %.

In an embodiment, the metal layer may have an indium content equal to or less than about 0.4 at %.

In an embodiment, the metal layer may have a thickness in a range of about 2,000 Å to about 20,000 Å.

In an embodiment, the metal layer may have a thickness in a range of about 7,500 Å to about 8,500 Å, and a sheet resistance value in a range of about 0.02Ω/□ to about 0.03 Ω/□.

In an embodiment, the metal layer may have a thickness in a range of about 2,500 Å to about 3,500 Å, and a sheet resistance value in a range of about 0.06Ω/□ to about 0.08 Ω/□.

In an embodiment, the metal layer may have a line edge roughness equal to or less than about 0.195 μm.

In an embodiment, the display device may further include a via layer disposed on the conductive layers in the display area, wherein the conductive layers may include a first conductive layer including a lower metal layer disposed in the display area and a first pad wire disposed in the pad area, a second conductive layer including gate electrodes disposed in the display area on the first conductive layer and a second pad wire disposed in the pad area, and a third conductive layer including a first conductive pattern disposed in the display area on the second conductive layer and a pad electrode lower layer disposed in the pad area, and the display device may further include a pad electrode upper layer disposed on the pad electrode lower layer in the pad area, and a pad electrode capping layer disposed on the pad electrode upper layer.

In an embodiment, the display device may further include a first gate insulating layer disposed between the first conductive layer and the second conductive layer, a first interlayer insulating layer disposed between the second conductive layer and the third conductive layer, and a first passivation layer disposed on the third conductive layer, wherein each of the first gate insulating layer, the first interlayer insulating layer, and the first passivation layer contains an inorganic insulating material.

In an embodiment, the conductive layer may further include a fourth conductive layer disposed on the third conductive layer and including a first voltage line and a second voltage line, the display device may further include a second interlayer insulating layer disposed on the first passivation layer, and a second passivation layer disposed on the fourth conductive layer.

In an embodiment, the display device may further include a first electrode and a second electrode disposed on the via layer in the display area and spaced apart from each other, a first insulating layer disposed on the first electrode and the second electrode, light emitting elements disposed on the first electrode and the second electrode spaced apart from each other on the first insulating layer, a first connection electrode disposed on the first electrode and electrically contacting the light emitting element, and a second connection electrode disposed on the second electrode and electrically contacting the light emitting element, wherein the via layer may include a trench exposing a portion of a top surface of the second passivation layer, at least a portion of the first electrode and the second electrode may be disposed directly on the second passivation layer in the trench, and the light emitting elements may be disposed in the trench.

In an embodiment, the pad electrode upper layer, the first electrode, and the second electrode may contain a same material, and the pad electrode capping layer, the first connection electrode, and the second connection electrode may contain a same material.

According to an embodiment of the disclosure, a wiring substrate may include conductive layers including wires and conductive patterns disposed on a substrate, and at least one insulating layer disposed between the conductive layers, wherein at least one of the conductive layers may contain a copper-indium alloy, and may include a metal layer having a grain size equal to or less than about 140 nm and a resistivity equal to or less than about 2.3 μΩcm.

In an embodiment, the metal layer may have an indium content equal to or less than about 1 at %.

In an embodiment, the metal layer may have an indium content equal to or less than about 0.4 at %.

In an embodiment, the metal layer may have a thickness in a range of about 2,000 Å to about 20,000 Å.

In an embodiment, the metal layer may have a thickness in a range of about 7,500 Å to about 8,500 Å, and a sheet resistance value in a range of about 0.02Ω/□ to about 0.03 Ω/□.

In an embodiment, the metal layer may have a thickness in a range of about 2,500 Å to about 3,500 Å, and a sheet resistance value in a range of about 0.06Ω/□ to about 0.08 Ω/□.

In an embodiment, the metal layer may have a line edge roughness equal to or less than about 0.195 μm.

In a wiring substrate according to one embodiment, wires and a conductive pattern of conductive layers contain a copper-indium alloy having a small grain size, and thus may have smooth surfaces and improved straightness.

A display device according to one embodiment may include the wiring substrate and have a low resistivity value, thereby preventing a short circuit between wires and a burn defect.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will become more apparent by describing in detail embodiments thereof with reference to the attached drawings, in which:

FIG. 6 is a schematic cross-sectional view taken along line E2-E2' of FIG. 4;

FIG. 16 is a schematic cross-sectional view illustrating a portion of a display device according to another embodiment;

DETAILED DESCRIPTION OF THE EMBODIMENTS

Figure 1:
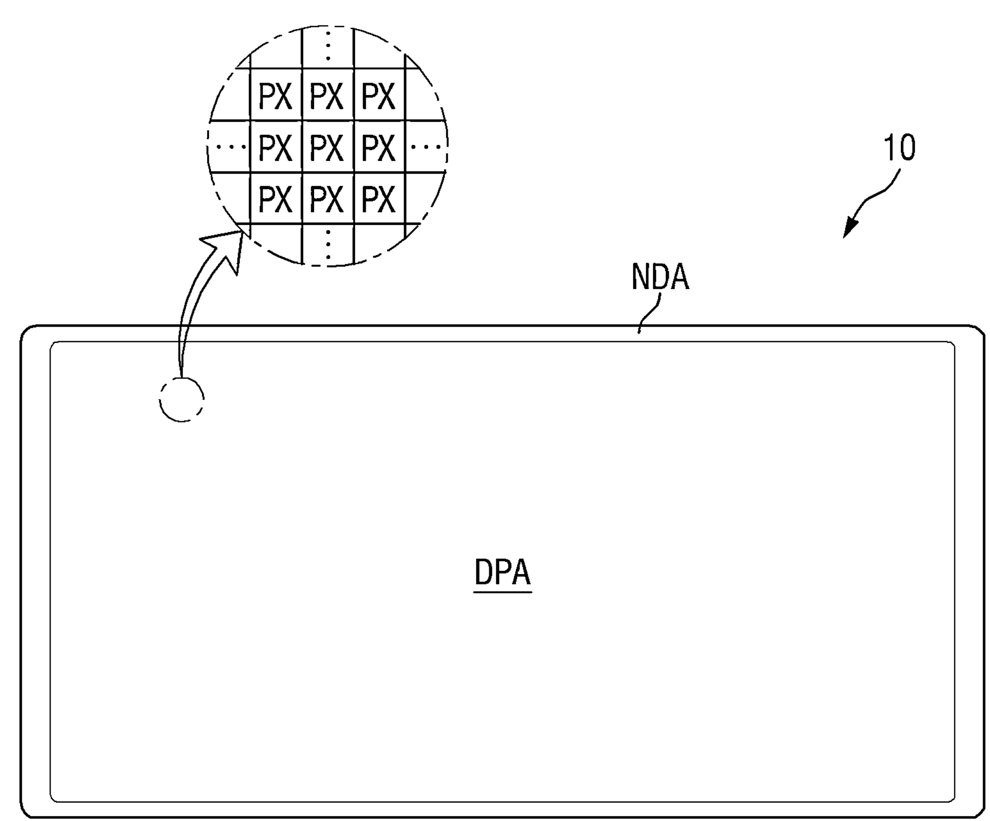
FIG. 1 is a schematic plan view of a display device according to one embodiment.
Figure 1:
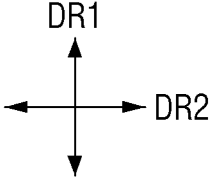

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Each of the features of the various embodiments of the disclosure may be combined or combined with each other, in part or in whole, and technically various interlocking and driving may be possible. Each embodiment may be implemented independently of each other or may be implemented together in an association.

Hereinafter, illustrative embodiments will be described in detail with reference to the accompanying drawings.

FIG. 1 is a schematic plan view of a display device according to one embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel which provides a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel may be applied as a display panel will be described, but the disclosure is not limited thereto, and other display panels may be applied within the same scope of technical spirit.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA. The display area DPA may be an area where a screen can be displayed, and the non-display area NDA may be an area where a screen is not displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in plan view. However, the disclosure is not limited thereto, and it may be a rhombic shape in which each side is inclined with respect to one direction. The pixels PX may be arranged in a stripe type or an island type. Each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers included in the display device 10 may be disposed in the non-display area NDA, or external devices may be mounted thereon.

Figure 2:
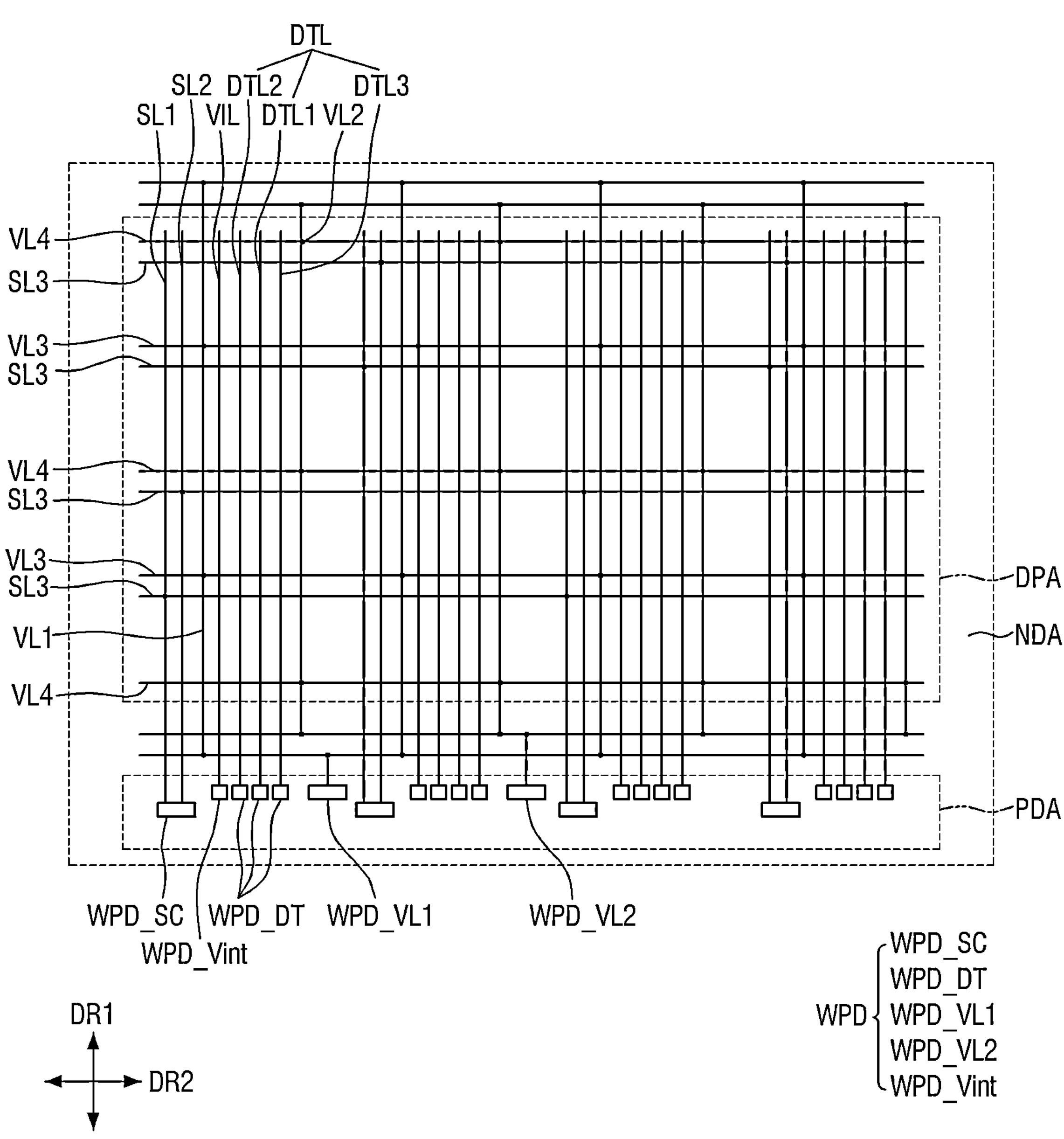
FIG. 2 is a schematic plan view illustrating an arrangement of multiple wires included in a display device according to one embodiment.

FIG. 2 is a schematic plan view illustrating an arrangement of wires included in a display device according to one embodiment.

Referring to FIG. 2, the display device 10 may include wires. The display device 10 may include scan lines SL (SL1, SL2, and SL3), data lines DTL (DTL1, DTL2, and DTL3), an initialization voltage line VIL, and voltage lines VL (VL1, VL2, VL3, and VL4). Although not shown in the drawing, other wires may be further provided in the display device 10.

The first scan line SL1 and the second scan line SL2 may be disposed to extend in the first direction DR1. The first scan line SL1 and the second scan line SL2 may be disposed adjacent to each other, and may be disposed to be spaced apart from the different first scan line SL1 and second scan line SL2 in the second direction DR2. The first scan line SL1 and the second scan line SL2 may be connected to a scan line pad WPD_SC connected to a scan driver (not illustrated). The first scan line SL1 and the second scan line SL2 may be disposed to extend from the pad area PDA disposed in the non-display area NDA to the display area DPA.

The third scan line SL3 may be disposed to extend in the second direction DR2, and may be disposed to be spaced apart from the other third scan line SL3 in the first direction DR1. One third scan line SL3 may be connected to one or more first scan lines SL1 or one or more second scan lines SL2. In one embodiment, the first scan line SL1 and the second scan line SL2 may be formed as a conductive layer disposed on a different layer from the third scan line SL3. The scan lines SL may have a mesh structure in the entire surface of the display area DPA, but is not limited thereto.

The data lines DTL may be disposed to extend in the first direction DR1. The data line DTL includes a first data line DTL1, a second data line DTL2, and a third data line DTL3, and each one of the first to third data lines DTL1, DTL2, and DTL3 forms a pair and may be disposed adjacent to each other. Each of the data lines DTL1, DTL2, and DTL3 may be disposed to extend from the pad area PDA disposed in the non-display area NDA to the display area DPA. However, the disclosure is not limited thereto, and the data lines DTL may be spaced apart from each other at equal intervals between a first voltage line VL1 and a second voltage line VL2 to be described later.

The initialization voltage line VIL may be disposed to extend in the first direction DR1. The initialization voltage line VIL may be disposed between the data lines DTL and the first scan line SL1 and the second scan line SL2. The initialization voltage line VIL may be disposed to extend from the pad area PDA disposed in the non-display area NDA to the display area DPA.

The first voltage line VL1 and the second voltage line VL2 may be disposed to extend in the first direction DR1, and the third voltage line VL3 and the fourth voltage line VL4 may be disposed to extend in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may be disposed to extend in the first direction DR1 to cross the display area DPA, and as for the third voltage line VL3 and the fourth voltage line VL4, some of the wires may be disposed in the display area DPA and other wires may be disposed in the non-display area NDA positioned on both sides of the display area DPA in the first direction DR1, respectively. The first voltage line VL1 and the second voltage line VL2 may be formed as a conductive layer disposed on a different layer from the third voltage line VL3 and the fourth voltage line VL4. The first voltage line VL1 may be connected to at least one third voltage line VL3, the second voltage line VL2 may be connected to at least one fourth voltage line VL4, and the voltage lines VL may have a mesh structure in the entire display area DPA. However, the disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each wiring pad WPD may be disposed in the non-display area NDA. In one embodiment, each of the line pads WPD may be disposed in the pad area PDA positioned on the lower side, which may be the other side of the display area DPA in the first direction DR1. The first scan line SL1 and the second scan line SL2 may be connected to the scan line pad WPD_SC disposed in the pad area PDA, and the data lines DTL may be connected to the data line pads WPD_DT different from each other, respectively. The initialization voltage line VIL may be connected to an initialization line pad WPD_Vint, the first voltage line VL1 may be connected to a first voltage line pad WPD_VL1, and the second voltage line VL2 may be connected to a second voltage line pad WPD_VL2. The external devices may be mounted on the line pads WPD. The external devices may be mounted on the line pads WPD by applying an anisotropic conductive film, ultrasonic bonding or the like. The drawing exemplifies that each of the line pads WPD may be disposed on the pad area PDA disposed on the lower side of the display area DPA, but is not limited thereto. Some of the line pads WPD may be disposed in any one area on the upper side or on the left and right sides of the display area DPA.

Each pixel PX or sub-pixel SPXn (n is an integer of 1 to 3) of the display device 10 includes a pixel driving circuit. The above-described wires may pass through each pixel PX or the vicinity thereof to apply a driving signal to each pixel driving circuit. The pixel driving circuit may include transistors and capacitors. The number of the transistors and the capacitors of each pixel driving circuit may be variously modified. According to one embodiment, in each sub-pixel SPXn of the display device 10, the pixel driving circuit may have a 3T1C structure including three transistors and one capacitor. Hereinafter, the pixel driving circuit of the 3T1C structure will be described as an example, but the disclosure is not limited thereto, and various other modified structures such as a 2T1C structure, a 7T1C structure, and a 6T1C structure may be applied.

Figure 3:
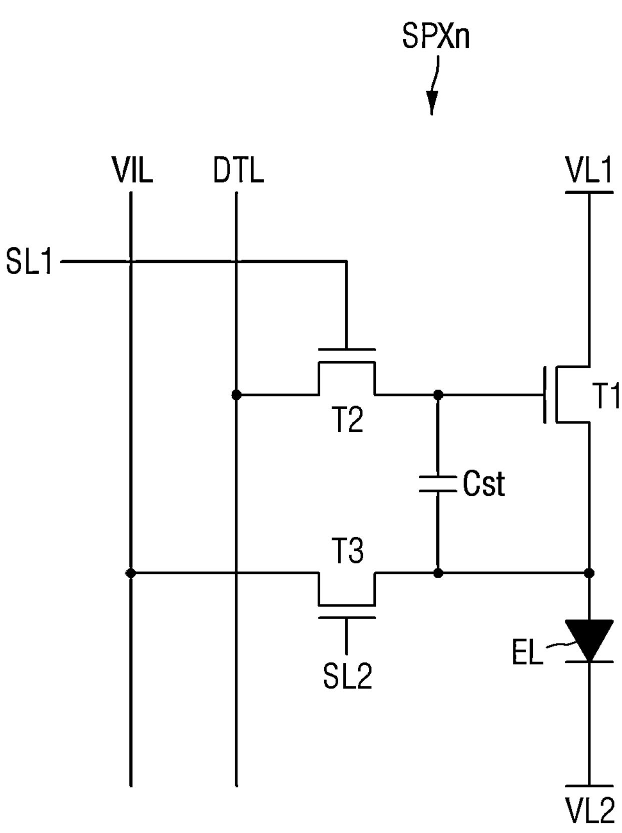
FIG. 3 is a schematic diagram of an equivalent circuit of a sub-pixel according to one embodiment.

FIG. 3 is a schematic diagram of an equivalent circuit of a sub-pixel according to one embodiment.

Referring to FIG. 3, each sub-pixel SPXn of the display device 10 according to one embodiment includes three transistors T1, T2 and T3 and one storage capacitor Cst in addition to a light emitting diode EL.

The light emitting diode EL emits light by a current supplied through a first transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first transistor T1, and the other end thereof may be connected to the second voltage line VL2 to which a low potential voltage (hereinafter, a second power voltage) lower than a high potential voltage (hereinafter, a first power voltage) of the first voltage line VL1 may be supplied.

The first transistor T1 adjusts a current flowing from the first voltage line VL1, to which the first power voltage may be supplied, to the light emitting diode EL according to the voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode of the first transistor T1 may be connected to the first electrode of the light emitting diode EL, and the drain electrode of the first transistor T1 may be connected to the first voltage line VL1 to which the first power voltage may be applied.

The second transistor T2 may be turned on by a scan signal of a first scan line SL1 to connect the data line DTL to the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

The third transistor T3 may be turned on by a scan signal of the second scan line SL2 to connect the initialization voltage line VIL to one end of the light emitting diode EL. The gate electrode of the third transistor T3 may be connected to the second scan line SL2, the drain electrode thereof may be connected to the initialization voltage line VIL, and the source electrode thereof may be connected to one end of the light emitting diode EL or to the source electrode of the first transistor T1.

In one embodiment, the source electrode and the drain electrode of each of the transistors T1, T2, and T3 are not limited to those described above, and vice versa. Further, each of the transistors T1, T2, and T3 may be formed of a thin film transistor. In FIG. 3, each of the transistors T1, T2, and T3 has been described as being formed of an N-type metal oxide semiconductor field effect transistor (MOSFET), but is not limited thereto. For example, each of the transistors T1, T2, and T3 may be formed of a P-type MOSFET. In other embodiments, some of the transistors T1, T2, and T3 may be formed of an N-type MOSFET and the others may be formed of a P-type MOSFET.

The storage capacitor Cst may be formed between the gate electrode and the source electrode of the first transistor T1. The storage capacitor Cst stores a difference voltage between a gate voltage and a source voltage of the first transistor T1.

Hereinafter, a structure of one pixel PX of the display device 10 according to one embodiment will be described in detail with further reference to other drawings.

Figure 4:
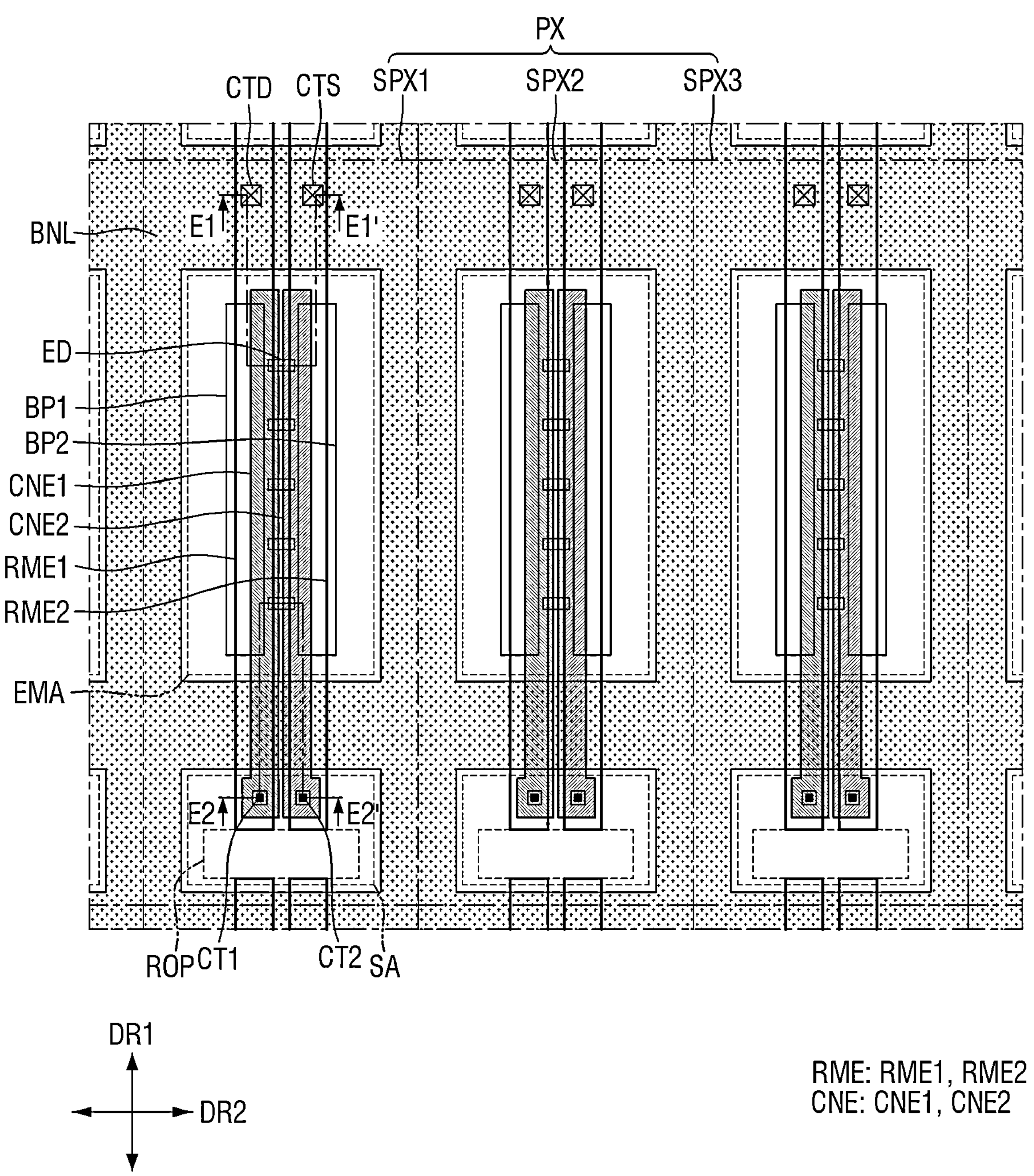
FIG. 4 is a schematic plan view illustrating one pixel of a display device according to one embodiment.

FIG. 4 is a schematic plan view illustrating one pixel of a display device according to one embodiment. FIG. 4 illustrates planar arrangement of electrodes RME (RME1 and RME2), bank patterns BP1 and BP2, a bank layer BNL, light emitting elements ED, and connection electrodes CNE (CNE1 and CNE2) disposed in one pixel PX of the display device 10.

Referring to FIG. 4, each of the pixels PX of the display device 10 may include sub-pixels SPXn. For example, one pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of the same color. In one embodiment, each of the sub-pixels SPXn may emit blue light. Although it is illustrated in the drawing that one pixel PX includes three sub-pixels SPXn, the disclosure is not limited thereto, and the pixel PX may include a larger number of sub-pixels SPXn.

Each sub-pixel SPXn of the display device 10 may include an emission area EMA and a non-emission area. The emission area EMA may be an area in which the light emitting element ED may be disposed to emit light of a specific wavelength band. The non-emission area may be a region in which the light emitting element ED is not disposed and a region from which light is not emitted because light emitted from the light emitting element ED does not reach there.

The emission area EMA may include the region in which the light emitting element ED may be disposed, and a region adjacent to the light emitting element ED in which the lights emitted from the light emitting element ED may be emitted. For example, the emission area EMA may further include a region in which the light emitted from the light emitting element ED may be reflected or refracted by another member and emitted. The light emitting elements ED may be disposed in each sub-pixel SPXn, and the emission area may be formed to include an area where the light emitting elements ED may be disposed and an area adjacent thereto.

Although it is shown in the drawing that the sub-pixels SPXn have the emission areas EMA that are substantially identical in size, the disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA of the corresponding sub-pixel SPXn may be disposed on the lower side of the emission area EMA, which may be the other side in the first direction DR1. The emission area EMA and the sub-region SA may be alternately arranged along the first direction DR1, and the sub-region SA may be disposed between the emission areas EMA of different sub-pixels SPXn spaced apart from each other in the first direction DR1. For example, the emission area EMA and the sub-region SA may be alternately arranged in the first direction DR1, and each of the emission area EMA and the sub-region SA may be repeatedly arranged in the second direction DR2. However, the disclosure is not limited thereto, and the arrangement of the emission areas EMA and the sub-regions SA in the pixels PX may be different from that shown in FIG. 4.

Light may not be emitted from the sub-region SA because the light emitting element ED may not be disposed in the sub-region SA, but an electrode RME disposed in each sub-pixel SPXn may be partially disposed in the sub-region SA. The electrodes RME disposed in different sub-pixels SPXn may be disposed to be separated at a separation portion ROP of the sub-region SA.

Each of the wires and the circuit elements of a circuit layer disposed on each pixel PX and connected to the light emitting element ED may be connected to the first to third sub-pixels SPX1, SPX2, and SPX3. However, the wires and the circuit elements may not be disposed to correspond to the area occupied by each sub-pixel SPXn or the emission area EMA, and may be disposed regardless of the position of the emission area EMA within one pixel PX.

The bank layer BNL may be disposed to surround the sub-pixels SPXn, the emission area EMA, and the sub-region SA. The bank layer BNL may be disposed at the boundary between the sub-pixels SPXn adjacent in the first direction DR1 and the second direction DR2, and may also be disposed at the boundary between the emission area EMA and the sub-region SA. The sub-pixels SPXn, the emission area EMA, and the sub-region SA of the display device 10 may be the areas delimited by the arrangement of the bank layer BNL. The gaps between the sub-pixels SPXn, the emission areas EMA, and the sub-regions SA may vary depending on the width of the bank layer BNL.

The bank layer BNL may include portions extending in the first direction DR1 and the second direction DR2 in plan view to be arranged in a grid pattern over the entire surface of the display area DPA. The bank layer BNL may be disposed along the boundaries between the sub-pixels SPXn to delimit the neighboring sub-pixels SPXn. The bank layer BNL may also be arranged to surround the emission area EMA and the sub-region SA disposed for each sub-pixel SPXn to delimit them from each other.

Figure 5:
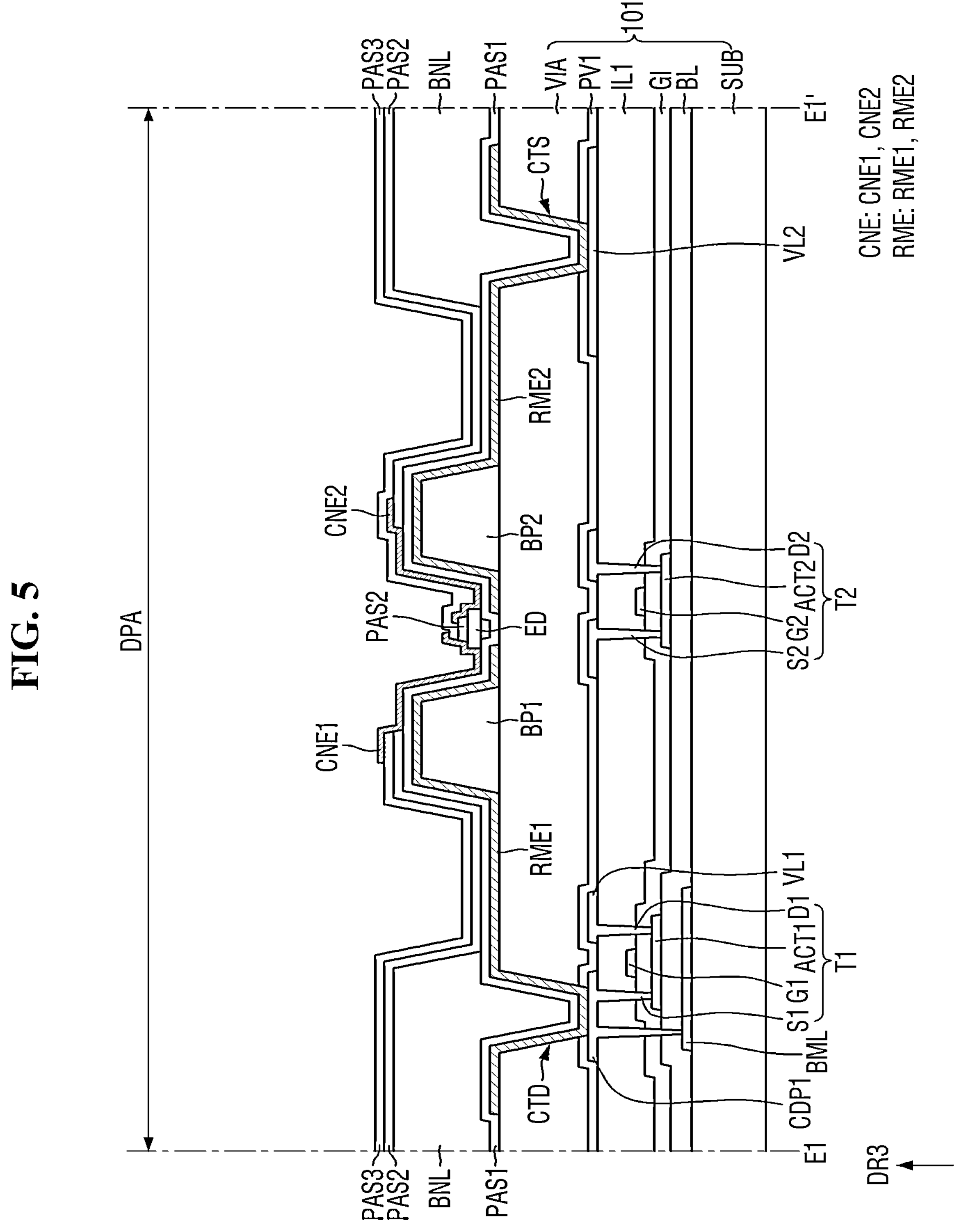
FIG. 5 is a schematic cross-sectional view taken along line E1-E1' of FIG. 4.

FIG. 5 is a schematic cross-sectional view taken along line E1-E1' of FIG. 4. FIG. 6 is a schematic cross-sectional view taken along line E2-E2' of FIG. 4. FIG. 5 illustrates a cross section across both ends of the light emitting element ED and electrode contact holes CTD and CTS disposed in the first sub-pixel SPX1, and FIG. 6 illustrates a cross section across both ends of the light emitting element ED and contact portions CT1 and CT2 disposed in the first sub-pixel SPX1.

Referring to FIGS. 5 and 6 in conjunction with FIG. 4, the display device 10 may include a wiring substrate 101 including a first substrate SUB, and a semiconductor layer, conductive layers, and insulating layers that are disposed on the first substrate SUB. Further, the display device 10 may include the electrodes RME (RME1 and RME2), the light emitting element ED, and connection electrodes CNE (CNE1 and CNE2) that may be disposed on the wiring substrate 101. The semiconductor layer, the conductive layers, and the insulating layers of the wiring substrate 101 may each constitute a circuit layer of the display device 10.

The first substrate SUB may be an insulating substrate. The first substrate SUB may be made of an insulating material such as glass, quartz, or polymer resin. Further, the first substrate SUB may be a rigid substrate, but may be a flexible substrate which can be bent, folded or rolled. The first substrate SUB may include the display area DPA and the non-display area NDA surrounding the display area DPA, and the display area DPA may include the emission area EMA and the sub-region SA that is a portion of the non-emission area.

A first conductive layer may be disposed on the first substrate SUB. The first conductive layer includes a lower metal layer BML that may be disposed to overlap a first active layer ACT1 of a first transistor T1. The lower metal layer BML may prevent light from entering the first active layer ACT1 of the first transistor T1, or may be electrically connected to the first active layer ACT1 to stabilize electrical characteristics of the first transistor T1. However, the lower metal layer BML, may be omitted.

The buffer layer BL may be disposed on the lower metal layer BML and the first substrate SUB. The buffer layer BL may be formed on the first substrate SUB to protect the transistors of the pixel PX from moisture permeating through the first substrate SUB susceptible to moisture permeation, and may perform a surface planarization function.

The semiconductor layer may be disposed on the buffer layer BL. The semiconductor layer may include the first active layer ACT1 of the first transistor T1 and a second active layer ACT2 of the second transistor T2. The first active layer ACT1 and the second active layer ACT2 may be disposed to partially overlap a first gate electrode G1 and a second gate electrode G2 of a second conductive layer to be described later, respectively.

The semiconductor layer may include polycrystalline silicon, monocrystalline silicon, oxide semiconductor, and the like. In another embodiment, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IGZTO).

Although it is illustrated in the drawing that one first transistor T1 is disposed in the sub-pixel SPXn of the display device 10, but the disclosure is not limited thereto, and the display device 10 may include a larger number of transistors.

The first gate insulating layer GI may be disposed on the semiconductor layer and the buffer layer BL in the display area DPA. The first gate insulating layer GI may not be disposed in the pad area PDA. The first gate insulating layer GI may serve as a gate insulating film of each of the transistors T1 and T2. Although it is illustrated in the drawing that the first gate insulating layer GI is disposed on the entire buffer layer BL, the disclosure is not limited thereto. In some embodiments, the first gate insulating layer GI may be patterned together with the gate electrodes G1 and G2 of the second conductive layer, which will be described later, to be partially disposed between the second conductive layer and the active layers ACT1 and ACT2 of the semiconductor layer.

The second conductive layer may be disposed on the first gate insulating layer GI. The second conductive layer may include a first gate electrode G1 of the first transistor T1 and a second gate electrode G2 of the second transistor T2. The first gate electrode G1 may be disposed to overlap the channel region of the first active layer ACT1 in a third direction DR3 that may be a thickness direction, and the second gate electrode G2 may be disposed to overlap the channel region of the second active layer ACT2 in the third direction DR3 that may be the thickness direction. Although not shown in the drawing, the second conductive layer may further include one electrode of the storage capacitor.

A first interlayer insulating layer IL1 may be disposed on the second conductive layer. The first interlayer insulating layer IL1 may function as an insulating film between the second conductive layer and other layers disposed thereon, and may protect the second conductive layer.

A third conductive layer may be disposed on the first interlayer insulating layer ILL The third conductive layer may include the first voltage line VL1 and the second voltage line VL2, a first conductive pattern CDP1, a source electrode S1 and a drain electrode D1 of the transistor T1, and a source electrode S2 and a drain electrode D2 of the transistor T2 that may be disposed in the display area DPA. Although not shown in the drawing, the third conductive layer may further include the other electrode of the storage capacitor.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. A portion of the first voltage line VL1 may contact the first active layer ACT1 of the first transistor T1 through the contact hole penetrating the first interlayer insulating layer IL1 and the first gate insulating layer GI. The first voltage line VL1 may serve as a first drain electrode D1 of the first transistor T1. The second voltage line VL2 may be directly connected to the second electrode RME2 to be described later.

The first conductive pattern CDP1 may contact the first active layer ACT1 of the first transistor T1 through the contact hole penetrating the first interlayer insulating layer IL1 and the first gate insulating layer GI. The first conductive pattern CDP1 may contact the lower metal layer BML through another contact hole. The first conductive pattern CDP1 may serve as a first source electrode S1 of the first transistor T1. Further, the first conductive pattern CDP1 may be connected to the first electrode RME1 or the first connection electrode CNE1 to be described later. The first transistor T1 may transmit the first power voltage applied from the first voltage line VL1 to the first electrode RME1 or the first connection electrode CNE1.

The second source electrode S2 and the second drain electrode D2 may contact the second active layer ACT2 of the second transistor T2 through the contact holes penetrating the first interlayer insulating layer IL1 and the first gate insulating layer GI. The second transistor T2 may be any one of the switching transistors described with reference to FIG. 3. The second transistor T2 may transfer the signal applied from the data line DTL of FIG. 3 to the first transistor T1 or may transfer the signal applied from the initialization voltage line VIL of FIG. 3 to the other electrode of the storage capacitor.

A first passivation layer PV1 may be disposed on the third conductive layer. The first passivation layer PV1 may function as an insulating layer between the third conductive layer and other layers and may protect the third conductive layer.

The buffer layer BL, the first gate insulating layer GI, the first interlayer insulating layer ILL and the first passivation layer PV1 described above may be formed of inorganic layers stacked in an alternating manner. For example, the buffer layer BL, the first gate insulating layer GI, the first interlayer insulating layer ILL and the first passivation layer PV1 may be formed as a double layer formed by stacking, or a multilayer formed by alternately stacking, inorganic layers including at least one of silicon oxide ($SiO_x$), silicon nitride ($SiN_x$), or silicon oxynitride ($SiO_xN_y$). However, the disclosure is not limited thereto, and the buffer layer BL, the first gate insulating layer GI, the first interlayer insulating layer ILL and the first passivation layer PV1 may be formed as a single inorganic layer containing the above-described insulating material. Further, in some embodiments, the first interlayer insulating layer IL1 may be made of an organic insulating material such as polyimide (PI) or the like.

A via layer VIA may be disposed on the third conductive layer in the display area DPA. The via layer VIA may contain an organic insulating material, e.g., polyimide (PI), and may compensate the stepped portion formed by the conductive layers disposed thereunder to flatten the top surface. However, in some embodiments, the via layer VIA may be omitted.

The display device 10 may include, as a display element layer disposed on the via layer VIA of the wiring substrate 101, the bank patterns BP1 and BP2, the electrodes RME (RME1 and RME2), the bank layer BNL, the light emitting elements ED, and the connection electrodes CNE (CNE1 and CNE2). Further, the display device 10 may include insulating layers PAS1, PAS2, and PAS3 disposed on the wiring substrate 101.

The bank patterns BP1 and BP2 may be disposed in the emission area EMA of each sub-pixel SPXn. The bank patterns BP1 and BP2 may have a width (e.g., a predetermined or selectable width) in the second direction DR2 and may have a shape extending in the first direction DR1.

For example, the bank patterns BP1 and BP2 may include a first bank pattern BP1 and a second bank pattern BP2 spaced apart from each other in the second direction DR2 in the emission area EMA of each sub-pixel SPXn. The first bank pattern BP1 may be disposed on the left side with respect to the center of the emission area EMA, which may be one side in the second direction DR2, and the second bank patterns BP2 may be disposed on the right side with respect to the center of the emission area EMA, which may be the other side in the second direction DR2, while being spaced apart from the first bank pattern BP1. The first bank pattern BP1 and the second bank pattern BP2 may be alternately disposed along the second direction DR2 and may be disposed in an island-like pattern in the display area DPA. The light emitting elements ED may be arranged between the first bank pattern BP1 and the second bank pattern BP2.

The lengths of the first bank pattern BP1 and the second bank pattern BP2 in the first direction DR1 may be the same, and may be smaller than the length of the emission area EMA surrounded by the bank layer BNL in the first direction DR1. The first bank pattern BP1 and the second bank pattern BP2 may be spaced apart from a portion of the bank layer BNL extending in the second direction DR2. However, the disclosure is not limited thereto, and the bank patterns BP1 and BP2 may be integrated with the bank layer BNL, or may partially overlap the portion of the bank layer BNL extending in the second direction DR2. The lengths of the bank patterns BP1 and BP2 in the first direction DR1 may be greater than or equal to the length of the emission area EMA surrounded by the bank layer BNL in the first direction DR1.

The widths of the first bank pattern BP1 and the second bank pattern BP2 in the second direction DR2 may be the same. However, the disclosure is not limited thereto, and they may have different widths. For example, one bank pattern may have a larger width than the other bank pattern, and the bank pattern having a larger width may be disposed across the emission areas EMA of different sub-pixels SPXn adjacent in the second direction DR2. In the bank pattern disposed across the emission areas EMA, a portion of the bank layer BNL extending in the first direction DR1 may overlap the second bank pattern BP2 in the thickness direction. Although it is illustrated in the drawing that two bank patterns BP1 and BP2 having the same width are arranged for each sub-pixel SPXn, the disclosure is not limited thereto. The number and the shape of the bank patterns BP1 and BP2 may vary depending on the number or the arrangement structure of the electrodes RME.

The bank patterns BP1 and BP2 may be disposed on the via layer VIA. For example, each of the bank patterns BP1 and BP2 may be directly disposed on the via layer VIA, and may have a structure in which at least a part thereof protrudes from the top surface of the via layer VIA. The protruding portions of the bank patterns BP1 and BP2 may have inclined or curved side surfaces, and the light emitted from the light emitting element ED may be reflected by the electrode RME disposed on the bank patterns BP1 and BP2 and emitted in the upward direction of the via layer VIA. Unlike the illustrated example in the drawings, the bank patterns BP1 and BP2 may have a shape of a semi-circle or semi-ellipse whose outer surface is curved in cross-sectional view. The bank patterns BP1 and BP2 may include an organic insulating material such as polyimide (PI), but is not limited thereto.

The electrodes RME (RME1 and RME2) have a shape extending in one direction and may be disposed for each sub-pixel SPXn. The electrodes RME1 and RME2 may extend in the first direction DR1 to be disposed across the emission area EMA of the sub-pixel SPXn and the sub-region SA, and may be disposed to be spaced apart from each other in the second direction DR2. The electrodes RME may be electrically connected to the light emitting element ED to be described later. However, the disclosure is not limited thereto, and the electrodes RME may not be electrically connected to the light emitting element ED.

The display device 10 may include the first electrode RME1 and the second electrode RME2 arranged in each sub-pixel SPXn. The first electrode RME1 may be located on the left side with respect to the center of the emission area EMA, and the second electrode RME2 may be located on the right side with respect to the center of the emission area EMA while being spaced apart from the first electrode RME1 in the second direction DR2. A first electrode RME1 may be disposed on the first bank pattern BP1, and a second electrode RME2 may be disposed on the second bank pattern BP2. The first electrode RME1 and the second electrode RME2 may be partially arranged in the corresponding sub-pixel SPXn and the sub-region SA over the bank layer BNL. The first electrode RME1 and the second electrode RME2 of different sub-pixels SPXn may be separated with respect to the separation portion ROP located in the sub-region SA of one sub-pixel SPXn.

Although it is illustrated in the drawing that two electrodes RME have a shape extending in the first direction DR1 for each sub-pixel SPXn, the disclosure is not limited thereto. A larger number of electrodes RME may be disposed, or the electrodes RME may be partially bent and have different widths depending on positions.

The first electrode RME1 and the second electrode RME2 may be arranged at least on the inclined surfaces of the bank patterns BP1 and BP2. In one embodiment, the widths of the electrodes RME measured in the second direction DR2 may be smaller than the widths of the bank patterns BP1 and BP2 measured in the second direction DR2, and the gap between the first electrode RME1 and the second electrode RME2 in the second direction DR2 may be smaller than the gap between the bank patterns BP1 and BP2. At least a portion of the first electrode RME1 and the second electrode RME2 may be directly arranged on the via layer VIA, so that the first electrode RME1 and the second electrode RME2 may be arranged on the same plane.

The light emitting element ED disposed between the bank patterns BP1 and BP2 may emit light toward both ends, and the emitted light may be directed toward the electrodes RME disposed on the bank patterns BP1 and BP2. The electrodes RME may have a structure in which portions thereof disposed on the bank patterns BP1 and BP2 may reflect the light emitted from the light emitting element ED. The first electrode RME1 and the second electrode RME2 may be arranged to cover at least one side surface of the bank patterns BP1 and BP2 and may reflect the light emitted from the light emitting element ED.

The electrodes RME may directly contact the third conductive layer through the electrode contact holes CTD and CTS at the portions overlapping the bank layer BNL between the emission area EMA and the sub-region SA. The first electrode contact hole CTD may be formed in an area in which the bank layer BNL and the first electrode RME1 overlap, and the second electrode contact hole CTS may be formed in an area in which the bank layer BNL and the second electrode RME2 overlap. The first electrode RME1 may contact the first conductive pattern CDP1 through the first electrode contact hole CTD penetrating the via layer VIA and the first passivation layer PV1. The second electrode RME2 may contact the second voltage line VL2 through the second electrode contact hole CTS penetrating the via layer VIA and the first passivation layer PV1. The first electrode RME1 may be electrically connected to the first transistor T1 through the first conductive pattern CDP1, so that the first power voltage may be applied to the first electrode RME1, and the second electrode RME2 may be electrically connected to the second voltage line VL2, so that the second power voltage may be applied to the second electrode RME2. However, the disclosure is not limited thereto. In another embodiment, the electrodes RME1 and RME2 may not be electrically connected to the voltage lines VL1 and VL2 of the third conductive layer, respectively, and the connection electrode CNE to be described later may be directly connected to the third conductive layer.

The electrodes RME may include a conductive material having high reflectivity. For example, the electrodes RME may contain a metal such as silver (Ag), copper (Cu), or aluminum (Al), or may contain an alloy including aluminum (Al), nickel (Ni), lanthanum (La), or the like. In other embodiments, the electrodes RME may have a structure in which a metal layer such as titanium (Ti), molybdenum (Mo), and niobium (Nb) and the alloy may be stacked. In some embodiments, the electrodes RME may be formed as a double layer or a multilayer formed by stacking at least one metal layer made of an alloy including aluminum (Al) and titanium (Ti), molybdenum (Mo), and niobium (Nb).

The disclosure is not limited thereto, and each electrode RME may further include a transparent conductive material. For example, each electrode RME may include a material such as ITO, IZO, and ITZO. In some embodiments, each of the electrodes RME may have a structure in which at least one transparent conductive material and at least one metal layer having high reflectivity may be stacked, or may be formed as one layer including them. For example, each electrode RME may have a stacked structure of ITO/Ag/ITO, ITO/Ag/IZO, ITO/Ag/ITZO/IZO, or the like. The electrodes RME may be electrically connected to the light emitting element ED, and may reflect some of the lights emitted from the light emitting element ED in an upward direction of the first substrate SUB.

The first insulating layer PAS1 may be disposed in the entire display area DPA and may be disposed on the via layer VIA and the electrodes RME. The first insulating layer PAS1 may protect the electrodes RME and insulate electrodes RME different from each other. The first insulating layer PAS1 may be disposed to cover the electrodes RME before the bank layer BNL may be formed, so that it may be possible to prevent the electrodes RME from being damaged in a process of forming the bank layer BNL. The first insulating layer PAS1 may prevent the light emitting element ED disposed thereon from being damaged by directly contacting other members.

In an embodiment, the first insulating layer PAS1 may have stepped portions such that the top surface thereof may be partially depressed between the electrodes RME spaced apart in the second direction DR2. The light emitting element ED may be disposed on the top surface of the first insulating layer PAS1, where the stepped portions are formed, and thus a space may remain between the light emitting element ED and the first insulating layer PAS1.

The bank layer BNL may be disposed on the first insulating layer PAS1. The bank layer BNL may include portions extending in the first direction DR1 and the second direction DR2, and may surround the sub-pixels SPXn. The bank layer BNL may surround and delimit the emission area EMA and the sub-region SA of each sub-pixel SPXn, and may surround the outermost portion of the display area DPA and delimit the display area DPA and the non-display area NDA. The bank layer BNL may be disposed in the entire display area DPA to form a grid pattern, and the regions exposed by the bank layer BNL in the display area DPA may be the emission area EMA and the sub-region SA.

Similarly to the bank patterns BP1 and BP2, the bank layer BNL may have a certain height. In some embodiments, the top surface of the bank layer BNL may be higher than that of the bank patterns BP1 and BP2, and the thickness of the bank layer BNL may be equal to or greater than that of the bank patterns BP1 and BP2. The bank layer BNL may prevent ink from overflowing to adjacent sub-pixels SPXn in an inkjet printing process during the manufacturing process of the display device 10. The bank layer BNL may contain an organic insulating material such as polyimide, similarly to the bank patterns BP1 and BP2.

The light emitting elements ED may be arranged in the emission area EMA. The light emitting elements ED may be disposed between the bank patterns BP1 and BP2, and may be arranged to be spaced apart from each other in the first direction DR1. In one embodiment, the light emitting elements ED may have a shape extending in one direction, and both ends thereof may be disposed on different electrodes RME. The length of the light emitting element ED may be greater than the gap between the electrodes RME spaced apart from each other in the second direction DR2. The extension direction of the light emitting elements ED may be substantially perpendicular to the first direction DR1 in which the electrodes RME extend. However, the disclosure is not limited thereto, and the light emitting element ED may extend in the second direction DR2 or in a direction oblique to the second direction DR2.

The light emitting elements ED may be arranged on the first insulating layer PAS1. The light emitting element ED may have a shape extending in one direction, and may be disposed such that one direction in which the light emitting element ED extends may be parallel to the top surface of the first substrate SUB. As will be described later, the light emitting element ED may include semiconductor layers arranged along one direction in which the light emitting element ED extends, and the semiconductor layers may be sequentially arranged along the direction parallel with the top surface of the first substrate SUB. However, the disclosure is not limited thereto, and the semiconductor layers may be arranged in the direction perpendicular to the first substrate SUB in case that the light emitting element ED has another structure.

The light emitting elements ED disposed in each sub-pixel SPXn may emit light of different wavelength bands depending on a material constituting the semiconductor layer. However, the disclosure is not limited thereto, and the light emitting elements ED arranged in each sub-pixel SPXn may include the semiconductor layer of the same material and emit light of the same color.

The light emitting elements ED may be electrically connected to the electrode RME and the conductive layers below the via layer VIA while contacting the connection electrodes CNE (CNE1 and CNE2), and may emit light of a specific wavelength band by receiving an electrical signal.

The second insulating layer PAS2 may be disposed on the light emitting elements ED, the first insulating layer PAS1, and the bank layer BNL. The second insulating layer PAS2 may include a pattern portion disposed on the light emitting elements ED while extending in the first direction DR1 between the bank patterns BP1 and BP2. The pattern portion may be disposed to partially surround the outer surface of the light emitting element ED, and may not cover both sides or both ends of the light emitting element ED. The pattern portion may form a linear or island-like pattern in each sub-pixel SPXn in plan view. The pattern portion of the second insulating layer PAS2 may protect the light emitting element ED and fix the light emitting elements ED during a manufacturing process of the display device 10. Further, the second insulating layer PAS2 may be disposed to fill the space between the light emitting element ED and the second insulating layer PAS2 thereunder. Further, a portion of the second insulating layer PAS2 may be disposed on the bank layer BNL and in the sub-regions SA.

The connection electrodes CNE (CNE1 and CNE2) may be disposed on the electrodes RME and the bank patterns BP1 and BP2. The connection electrodes CNE may have a shape extending in one direction, and may be disposed to be spaced apart from each other. Each of the connection electrodes CNE may contact the light emitting element ED, and may be electrically connected to the third conductive layer.

The connection electrodes CNE may include the first connection electrode CNE1 and the second connection electrode CNE2 disposed in each sub-pixel SPXn. The first connection electrode CNE1 may have a shape extending in the first direction DR1 and may be disposed on the first electrode RME1 or the first bank pattern BP1. The first connection electrode CNE1 may partially overlap the first electrode RME1 and may be disposed across the emission area EMA and the sub-region SA over the bank layer BNL. The second connection electrode CNE2 may have a shape extending in the first direction DR1 and may be disposed on the second electrode RME2 or the second bank pattern BP2. The second connection electrode CNE2 may partially overlap the second electrode RME2 and may be disposed across the emission area EMA and the sub-region SA over the bank layer BNL. Each of the first connection electrode CNE1 and the second connection electrode CNE2 may contact the light emitting elements ED, and may be electrically connected to the electrodes RME or the conductive layer disposed thereunder.

For example, the first connection electrode CNE1 and the second connection electrode CNE2 may be disposed on the side surfaces of the second insulating layer PAS2 and may contact the light emitting elements ED. The first connection electrode CNE1 may partially overlap the first electrode RME1 and may contact an end of the light emitting elements ED. The second connection electrode CNE2 may partially overlap the second electrode RME2 and may contact another end of the light emitting elements ED. The connection electrodes CNE may be disposed across the emission area EMA and the sub-region SA. The connection electrodes CNE may contact the light emitting elements ED at portions disposed in the emission area EMA, and may be electrically connected to the third conductive layer at portions disposed in the sub-region SA.

In accordance with one embodiment, in the display device 10, the connection electrodes CNE may contact the electrode RME through the contact portions CT1 and CT2 disposed in the sub-region SA. The first connection electrode CNE1 may be in contact with the first electrode RME1 through the first contact portion CT1 penetrating the first insulating layer PAS1, the second insulating layer PAS2, and the third insulating layer PAS3 in the sub-region SA. The second connection electrode CNE2 may contact the second electrode RME2 through the second contact portion CT2 penetrating the first insulating layer PAS1 and the second insulating layer PAS2 in the sub-region SA. Each of the connection electrodes CNE may be electrically connected to the third conductive layer through each of electrodes RME. The first connection electrode CNE1 may be electrically connected to the first transistor T1, so that the first power voltage may be applied to the first connection electrode CNE1, and the second connection electrode CNE2 may be electrically connected to the second voltage line VL2, so that the second power voltage may be applied to the second connection electrode CNE2. Each connection electrode CNE may contact the light emitting element ED in the emission area EMA to transmit the power voltage to the light emitting element ED.

However, the disclosure is not limited thereto. In some embodiments, the connection electrodes CNE may directly contact the third conductive layer, and may be electrically connected to the third conductive layer through patterns other than the electrodes RME.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

The third insulating layer PAS3 may be disposed on the second connection electrode CNE2 and the second insulating layer PAS2. The third insulating layer PAS3 may be disposed on the entire second insulating layer PAS2 to cover the second connection electrode CNE2, and the first connection electrode CNE1 may be disposed on the third insulating layer PAS3. The third insulating layer PAS3 may be disposed on the entire via layer VIA except the region where the second connection electrode CNE2 may be disposed. The third insulating layer PAS3 may insulate the first connection electrode CNE1 and the second connection electrode CNE2 to prevent direct contact therebetween.

Although not illustrated in the drawings, another insulating layer may be further disposed on the third insulating layer PAS3 and the first connection electrode CNE1. The insulating layer may function to protect the members disposed on the first substrate SUB against the external environment.

Each of the first insulating layer PAS1, the second insulating layer PAS2 and the third insulating layer PAS3 described above may include an inorganic insulating material or an organic insulating material. For example, each of the first insulating layer PAS1, the second insulating layer PAS2, and the third insulating layer PAS3 may contain an inorganic insulating material, or the first insulating layer PAS1 and the third insulating layer PAS3 may contain an inorganic insulating material and the second insulating layer PAS2 may contain an organic insulating material. Each or at least one of the first insulating layer PAS1, the second insulating layer PAS2, and the third insulating layer PAS3 may have a structure in which insulating layers may be stacked alternately or repeatedly. In an embodiment, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material or different materials. In other embodiments, some of them may be made of the same material and some of them may be made of different materials.

Figure 7:
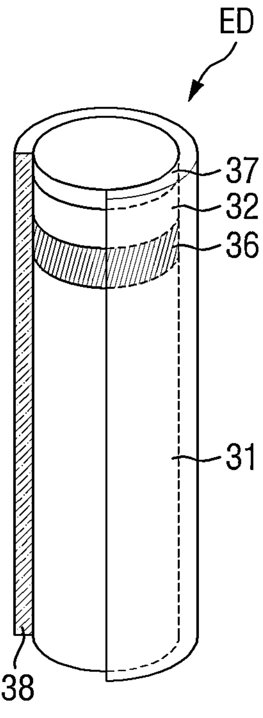
FIG. 7 is a schematic view of a light emitting element according to one embodiment.

FIG. 7 is a schematic view of a light emitting element according to one embodiment.

Referring to FIG. 7, the light emitting element ED may be a light emitting diode. The light emitting element ED may be an inorganic light emitting diode that has a nanometer or micrometer size, and may be made of an inorganic material. The light emitting element ED may be aligned between two electrodes having polarity in case that an electric field is formed in a specific direction between two electrodes facing each other.

The light emitting element ED according to one embodiment may have a shape elongated in one direction. The light emitting element ED may have a shape of a cylinder, a rod, a wire, a tube, or the like. However, the shape of the light emitting element ED is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37 and an insulating film 38.

The first semiconductor layer 31 may be an n-type semiconductor. The first semiconductor layer 31 may include a semiconductor material having a chemical formula of AlxGayIn1-x-yN ($0 \leq x \leq 1$, $0 \leq y \leq 1$, $0 \leq x+y \leq 1$). For example, the first semiconductor layer 31 may be any one or more of AlGaInN, GaN, AlGaN, InGaN, AlN and InN doped with an n-type dopant. The n-type dopant doped into the first semiconductor layer 31 may be Si, Ge, Se, Sn, or the like.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of AlxGayIn1-x-yN ($0 \leq x \leq 1$, $0 \leq y \leq 1$, $0 \leq x+y \leq 1$). For example, the second semiconductor layer 32 may be any one or more of AlGaInN, GaN, AlGaN, InGaN, AlN and InN doped with a p-type dopant. The p-type dopant doped into the second semiconductor layer 32 may be Mg, Zn, Ca, Ba, or the like.

Although it is illustrated in the drawing that the first semiconductor layer 31 and the second semiconductor layer 32 are configured as one layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer. For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be one or more of AlGaInN, GaN, AlGaN, InGaN, AlN, and InN doped with an n-type dopant, and the semiconductor layer disposed between the second semiconductor layer 32 and the light emitting layer 36 may be one or more of AlGaInN, GaN, AlGaN, InGaN, AlN and InN doped with a p-type dopant.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. In case that the light emitting layer 36 has a multiple quantum well structure in which quantum layers and well layers are alternately stacked, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy are alternately stacked, and may include other group III to V semiconductor materials according to the wavelength band of the emitted light. The light emitted by the light emitting layer 36 is not limited to the light of the blue wavelength band, but the light emitting layer 36 may also emit light of a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, in case that the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO.

The insulating film 38 may be arranged to surround the outer surfaces of the semiconductor layers and electrode layers described above. For example, the insulating film 38 may be disposed to surround at least the outer surface of the light emitting layer 36, and may be formed to expose both ends of the light emitting element ED in the longitudinal direction. Further, in a cross-sectional view, the insulating film 38 may have a top surface, which may be rounded in a region adjacent to at least one end of the light emitting element ED.

The insulating film 38 may include at least one of materials having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). It is illustrated in the drawing that the insulating film 38 is formed as a single layer, but the disclosure is not limited thereto. In some embodiments, the insulating film 38 may be formed in a multilayer structure having layers stacked therein.

The insulating film 38 may perform a function of protecting the semiconductor layers and the electrode layer of the light emitting element ED. The insulating film 38 may prevent an electrical short circuit that may be likely to occur at the light emitting layer 36 in case that an electrode to which an electrical signal is transmitted is in direct contact the light emitting element ED. The insulating film 38 may prevent a decrease in luminous efficiency of the light emitting element ED.

Further, the insulating film 38 may have an outer surface which may be surface-treated. The light emitting elements ED may be aligned in such a way of spraying the ink in which the light emitting elements ED may be dispersed on the electrodes. Here, the surface of the insulating film 38 may be treated to have a hydrophobic property or hydrophilic property in order to keep the light emitting elements ED in the dispersed state without being aggregated with other adjacent light emitting elements ED in the ink.

Figure 8:
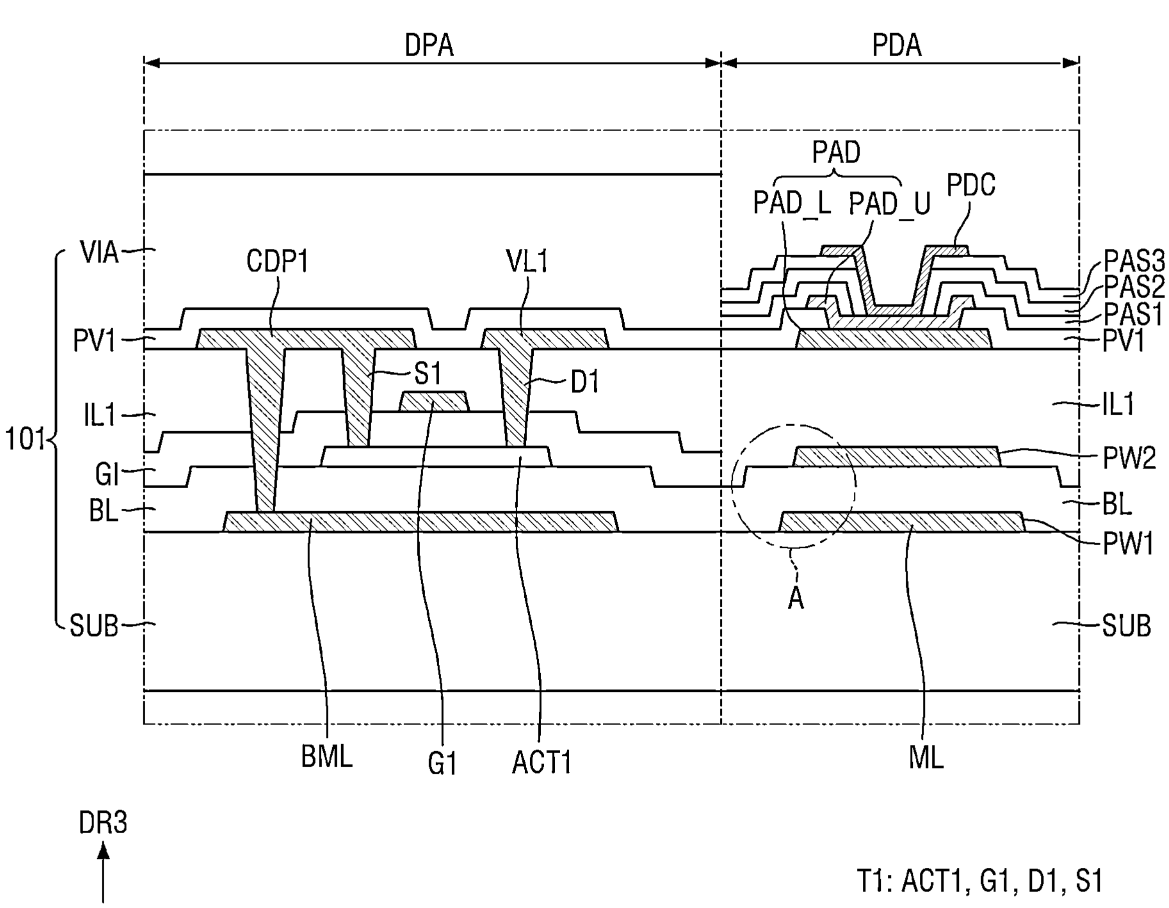
FIG. 8 is a schematic cross-sectional view illustrating a pad electrode and a first transistor formed by multiple wires and a conductive pattern disposed on the wiring substrate of a display device according to one embodiment.
Figure 9:
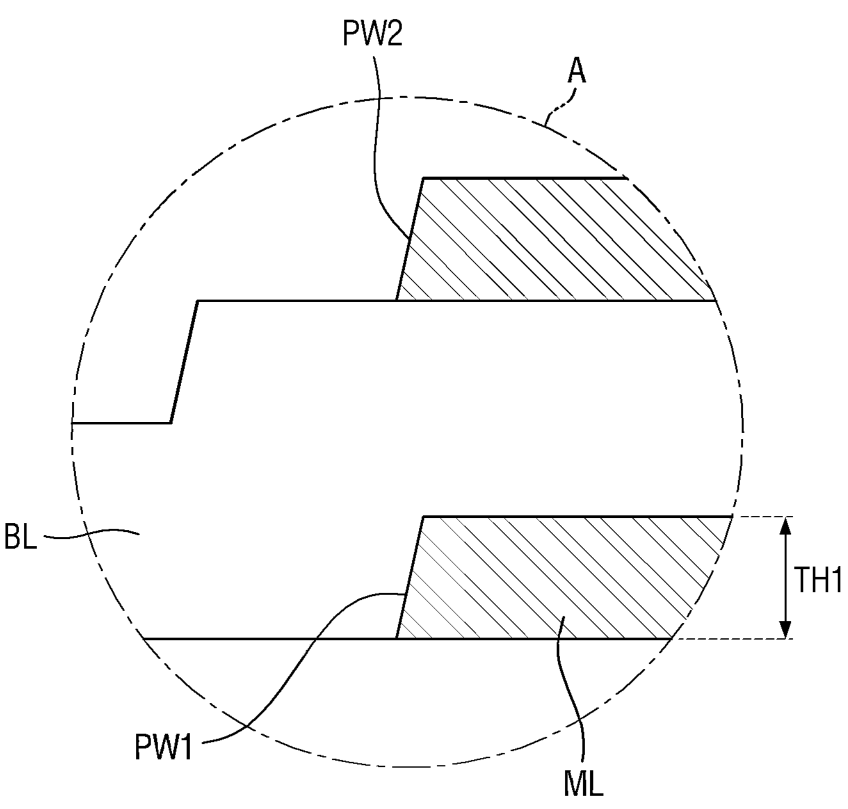
FIG. 9 is an enlarged view of part A of FIG. 8.

FIG. 8 is a schematic cross-sectional view illustrating a pad electrode and a first transistor formed by wires and a conductive pattern disposed on the wiring substrate of a display device according to one embodiment. FIG. 9 is an enlarged view of part A of FIG. 8. FIGS. 8 and 9 illustrate the first transistor T1 disposed in the display area DPA of the display device 10, and pad wires PW1 and PW2 and a pad electrode PAD disposed in the pad area PDA thereof. FIGS. 8 and 9 illustrate in detail the structure of the conductive layers included in the wiring substrate 101.

Referring to FIGS. 8 and 9 in conjunction with FIGS. 5 and 6, the display device 10 according to one embodiment may include the pad wires PW1 and PW2, and the pad electrode PAD, and a pad electrode capping layer PDC disposed in the pad area PDA. The pad wires PW1 and PW2 and a pad electrode base layer PAD_L of the pad electrode PAD may be formed as first to third conductive layers of the wiring substrate 101.

For example, the pad wires PW1 and PW2 may include a first pad wire PW1 and a second pad wire PW2. The first pad wire PW1 may be directly disposed on the first substrate SUB, and the second pad wire PW2 may be directly disposed on the buffer layer BL. The first pad wire PW1 may be formed as the first conductive layer in the pad area PDA of the wiring substrate 101, and the second pad wire PW2 may be formed as the second conductive layer in the pad area PDA of the wiring substrate 101.

The first pad wire PW1 may be formed with (e.g., formed simultaneously with) the lower metal layer BML, in the display area DPA and may contain the same material. The second pad wire PW2 may be formed with the gate electrodes G1 and G2 in the display area DPA and may contain the same material. Although it is illustrated in the drawing that the first pad wire PW1 and the second pad wire PW2 overlap each other in the thickness direction, the disclosure is not limited thereto. In some embodiments, each of the first pad wire PW1 and the second pad wire PW2 may be electrically connected to any one of the wires of the first to third conductive layers disposed in the display area DPA, and at least one of them may be electrically connected to the pad electrode PAD disposed thereon.

The pad electrode PAD may be disposed in the pad area PDA of the wiring substrate 101, and may be connected to any one of the above-described wire pads WPD. Although not shown in the drawing, the pad electrode PAD may be electrically connected to any one of the wires disposed in the display area DPA, and an electrical signal applied from the wire pad WPD may be transmitted to the wires in the display area DPA through the pad electrode PAD.

The pad electrode PAD may include the pad electrode base layer PAD_L and a pad electrode upper layer PAD_U disposed thereon. The pad electrode base layer PAD_L may be directly disposed on the first interlayer insulating layer ILL and the pad electrode upper layer PAD_U may be directly disposed on the first passivation layer PV1. The via layer VIA of the wiring substrate 101 may be disposed in the display area DPA and may not be disposed in the pad area PDA. The pad electrode base layer PAD_L may be formed as the third conductive layer, and may be formed with a first conductive pattern CDP1 of the display area DPA and contain the same material.

In the pad area PDA, the first passivation layer PV1 may be exposed without the via layer VIA disposed thereon. The pad electrode upper layer PAD_U may be formed with the electrode RME of the display area DPA and may contain the same material. The first insulating layer PAS1 disposed in the display area DPA may be directly disposed on the pad electrode upper layer PAD_U and the first passivation layer PV1, and the second insulating layer PAS2 and the third insulating layer PAS3 may be sequentially disposed thereon.

The pad electrode capping layer PDC may be disposed on the third insulating layer PAS3 in the pad area PDA of the wiring substrate 101. The pad electrode capping layer PDC may be formed with any one of the connection electrodes CNE in the display area DPA and may contain the same material. The pad electrode capping layer PDC may be in direct contact with the pad electrode upper layer PAD_U through the contact hole penetrating the first insulating layer PAS1, the second insulating layer PAS2, and the third insulating layer PAS3, and may be electrically connected thereto. The pad electrode capping layer PDC may be disposed on the pad electrode PAD and electrically connected to the pad electrode PAD while protecting the pad electrode PAD. The above-described wire pad WPD may be disposed on the pad electrode capping layer PDC.

According to one embodiment, the wiring substrate 101 of the display device 10 may include a metal layer ML in which at least one of the wires or conductive patterns of the first to third conductive layers may be made of a copper (Cu) alloy. For example, the first pad wire PW1 and the lower metal layer BML, of the first conductive layer may include the metal layer ML made of a Cu alloy. The first gate electrode G1 and the second pad wire PW2 of the second conductive layer, and the first conductive pattern CDP1, the first voltage line VL1, and the pad electrode base layer PAD_L of the third conductive layer may also each include the metal layer ML made of a Cu alloy. Each of the wires or the conductive patterns in the first to third conductive layers of the wiring substrate 101 may include the metal layer ML made of a Cu alloy. In other embodiments, the wires or the conductive patterns in any one or more of the first to third conductive layers may include the metal layer ML made of a Cu alloy, and the other conductive layers may not. The metal layer ML may be directly disposed on the first substrate SUB, the first gate insulating layer GI, or the first interlayer insulating layer IL1. The bottom surface of the metal layer ML may be in contact with the top surface of the first substrate SUB, the first gate insulating layer GI, or the first interlayer insulating layer IL1.

According to one embodiment, the metal layer ML of the conductive layers included in the wiring substrate 101 of the display device 10 may contain a Cu alloy and may have a grain size equal to or less than about 140 nm and resistivity equal to or less than about 2.3 μΩcm.

Each of the conductive layers of the wiring substrate 101 may be formed by depositing a metal material of the metal layer ML and patterning the metal material. In an embodiment, each of the conductive layers of the wiring substrate 101 may be patterned by an etching process using a non-peroxide-based etchant composition. In case that the conductive layers of the wiring substrate 101 are etched by the non-peroxide-based etchant composition, the metal layer of the conductive layer may have a difference in etching rate for the etchant composition between the inside of the grain and the grain boundary. Accordingly, the wires or the conductive patterns of the conductive layer may be patterned along the grain boundary of the material.

In the wiring substrate 101 according to one embodiment, in case that the wires or the conductive patterns of the conductive layer contain a Cu alloy, the grain size may be equal to or less than about 140 nm, and the etched surface may be formed to be smooth by having a small roughness along the boundary of the grain. For example, the wires extending in one direction among the conductive layers of the wiring substrate 10 may have smooth side surfaces patterned by the etchant composition, so that the straightness of the wire may be improved.

The wires and the conductive patterns included in the conductive layer of the wiring substrate 101 may have inclined side surfaces patterned by the etchant composition, and the side surface of the conductive layer may have a taper angle with respect to the top surface of the layer thereunder. The wires or the conductive patterns of the conductive layer may have a smooth etched surface as the metal layer ML has a small size of grain. Accordingly, in the wiring substrate 101, a step coverage defect that may occur in the insulating layer disposed on each of the conductive layers, e.g., the buffer layer BL disposed on the first conductive layer, may be reduced. The wiring substrate 101 according to one embodiment may have a smooth surface with improved straightness of the wires or the conductive patterns of the conductive layers, and improved roughness of the slope, and may have a low resistivity value, thereby preventing short circuit and burn defects that may occur in the wires.

According to one embodiment, the metal layer ML of at least one of the wires or the conductive patterns included in the wiring substrate 101 may contain a copper-indium (Cu—In) alloy to have a grain size equal to or less than about 140 nm. The metal layer ML containing a Cu—In alloy may have an indium (In) content equal to or less than about 1 at %. For example, the metal layer ML containing a Cu—In alloy may have an indium (In) content equal to or less than about 0.4 at %. The impurity metals contained in the copper alloy may penetrate the grain boundary of copper to suppress the growth of copper grains. Accordingly, the copper alloy containing copper as a main component and further containing a certain content of other impurity metals may have a grain size smaller than that of a pure copper metal. In an embodiment in which the metal layer ML may be made of a Cu—In alloy, as the impurity metal is contained in an amount equal to or less than about 1 at %, the grain size may be equal to or less than about 140 nm, and the resistivity value may be equal to or less than about 2.3 μΩcm. For example, the impurity metal may be contained in an amount equal to or less than about 0.4 at %.

According to one embodiment, a Cu alloy containing indium (In) as an impurity may have a different resistivity value depending on the content of the impurity. Copper alloys containing impurities may have a resistivity value which substantially decreases as the content of impurities decreases. For example, a Cu—In alloy containing indium (In) as an impurity may have a resistivity value equal to or less than about 2.3 μΩcm in case that it has an impurity content equal to or less than about 1 at %. For example, the Cu—In alloy containing indium (IN) as an impurity may have an impurity content equal to or less than about 0.4 at %.

In one embodiment, the metal layer ML may contain a Cu—In alloy to have a resistivity value equal to or less than about 2.3 μΩcm and a grain size equal to or less than about 140 nm. The wiring substrate 101 may have excellent wire straightness as the metal layer ML of each conductive layer contains a Cu—In alloy.

Figure 10A:
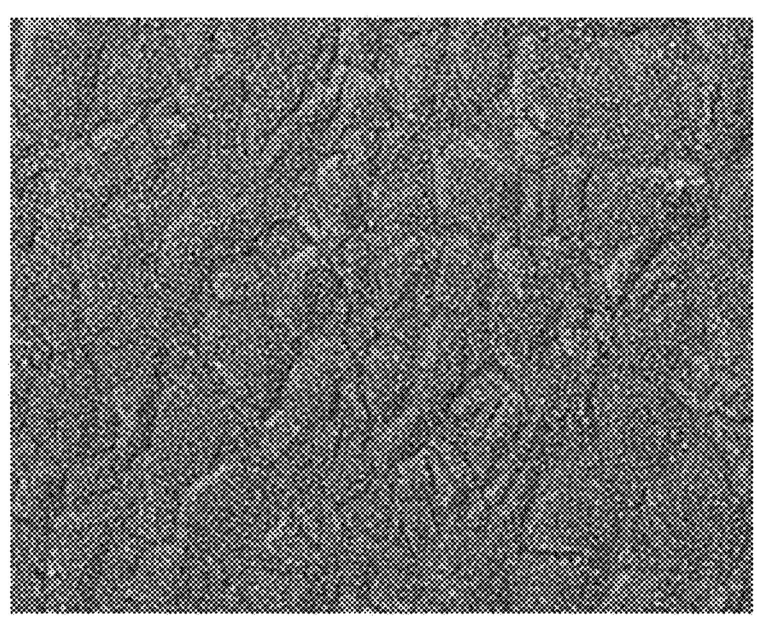
FIGS. 10A to 14C illustrate images of scanning electron microscope (SEM) and focused ion beam (FIB) showing a wire or a conductive pattern of a conductive layer.
Figure 10B:
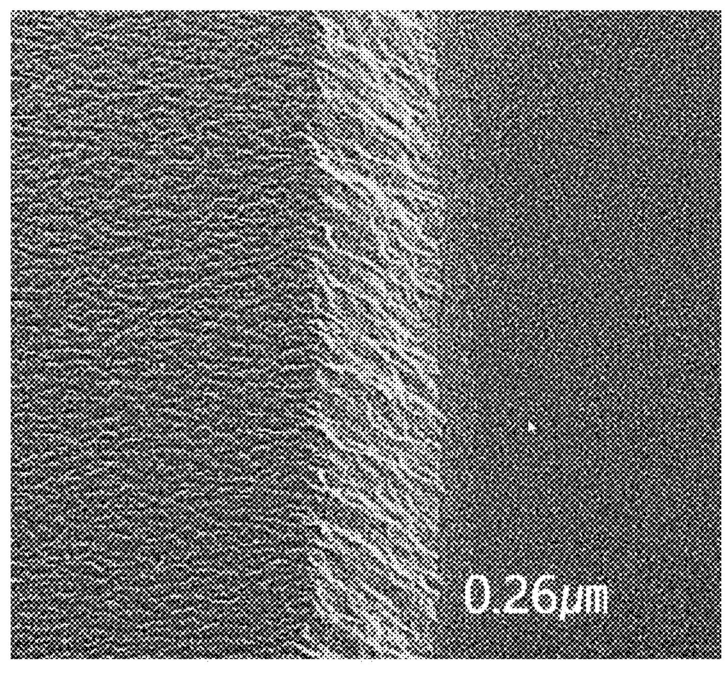
Figure 10C:
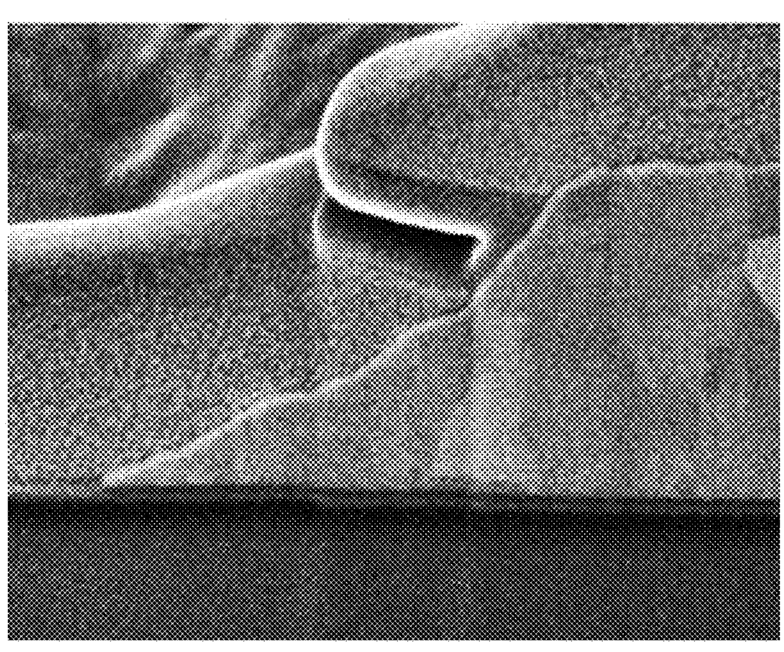
Figure 11A:
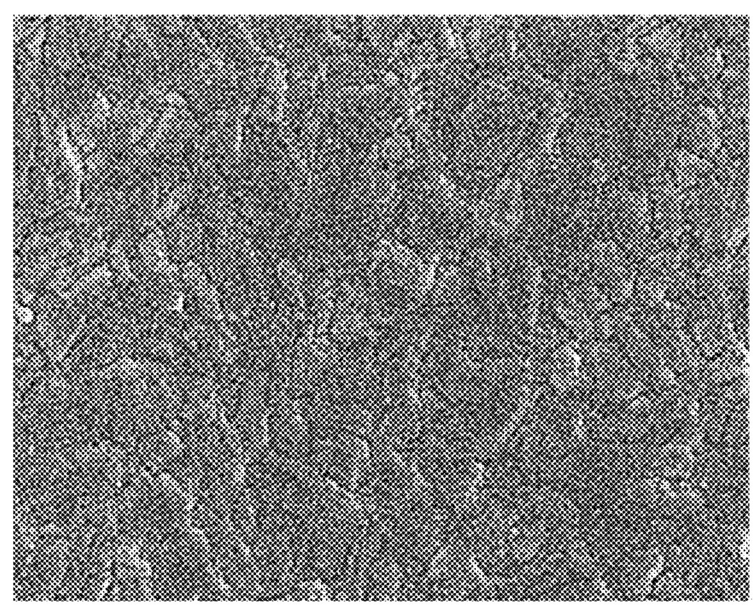
Figure 11B:
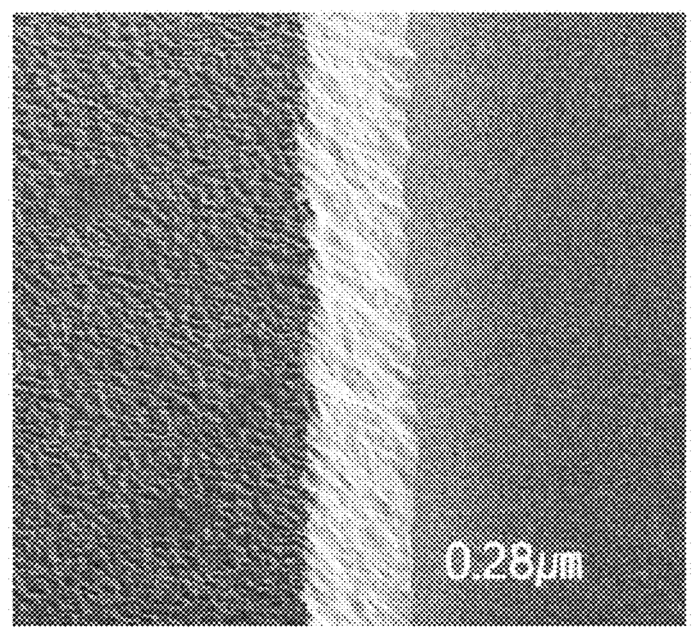
Figure 11C:
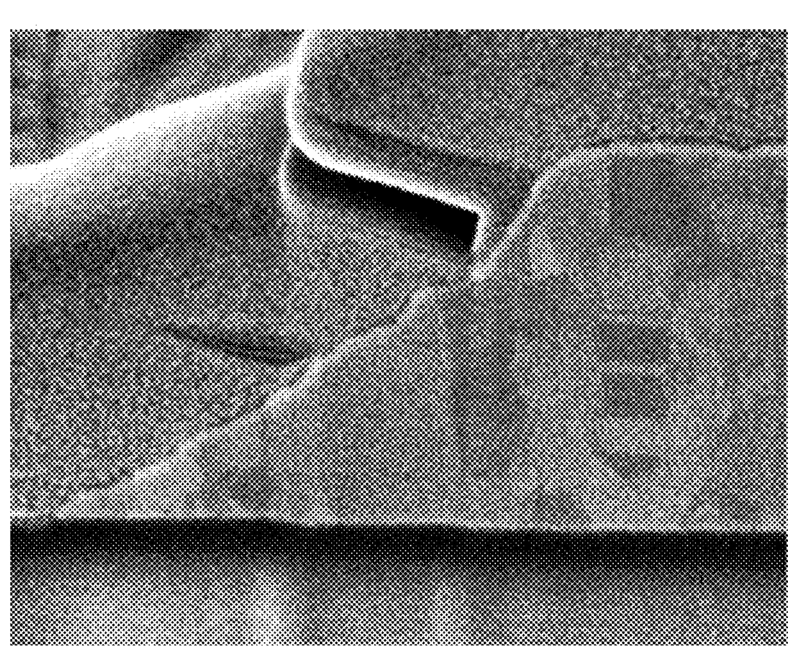
Figure 12A:
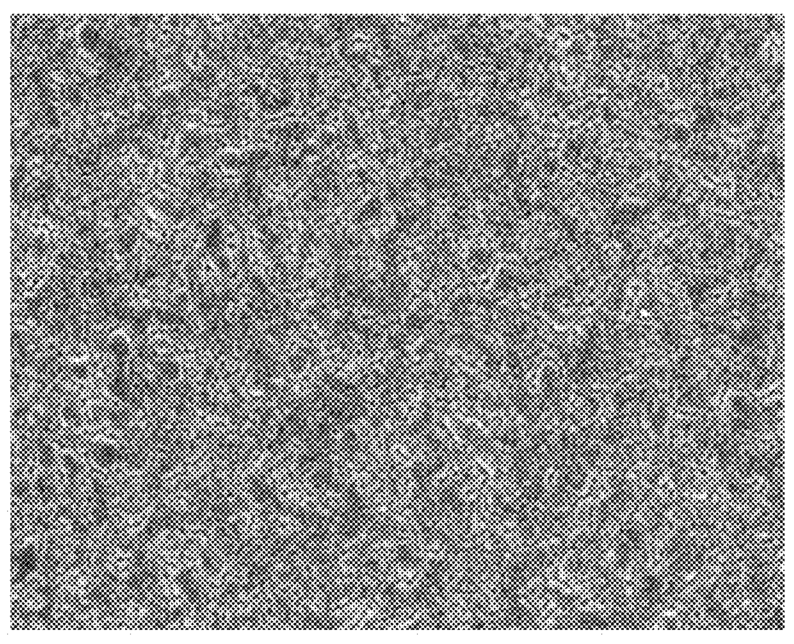
Figure 12B:
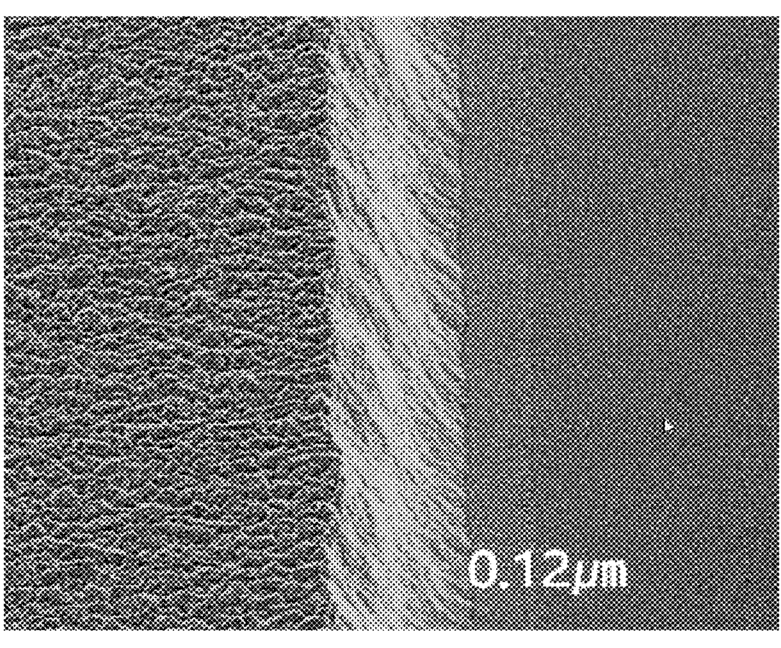
Figure 12C:
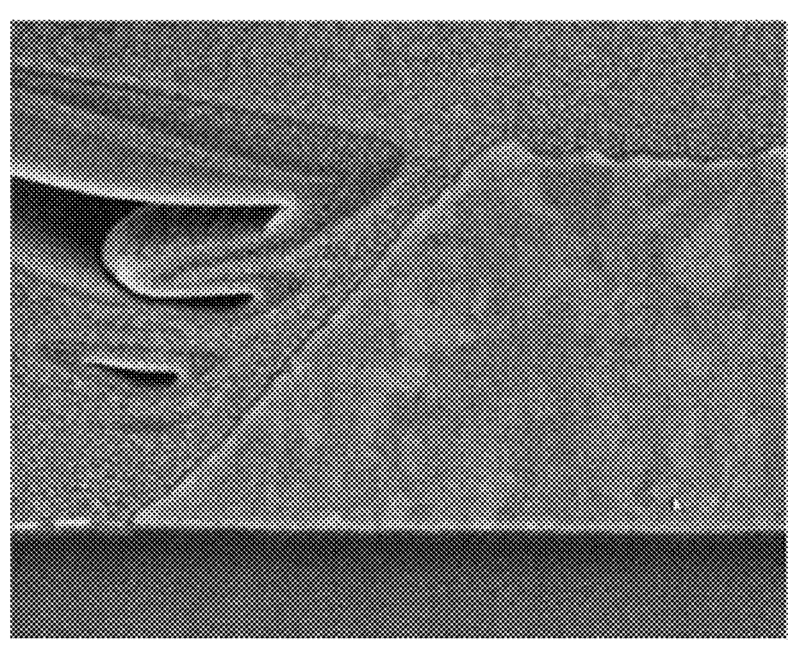
Figure 13A:
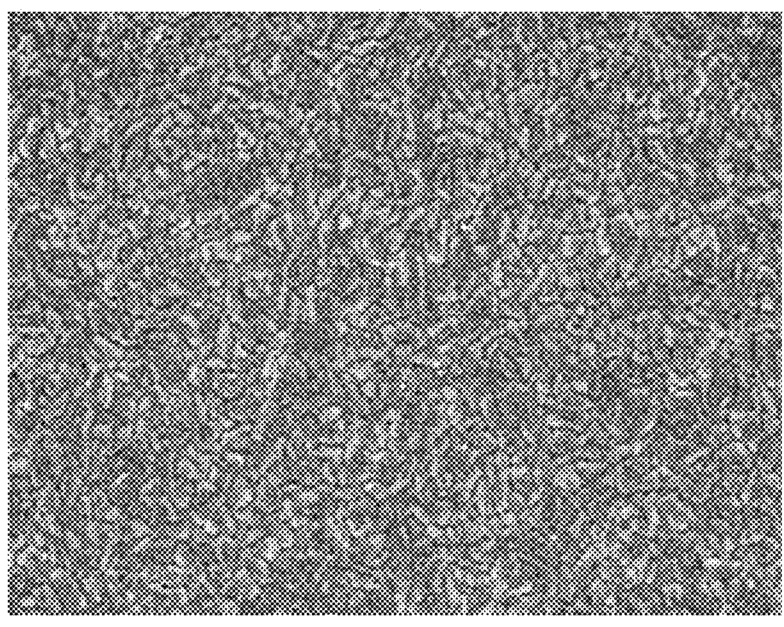
Figure 13B:
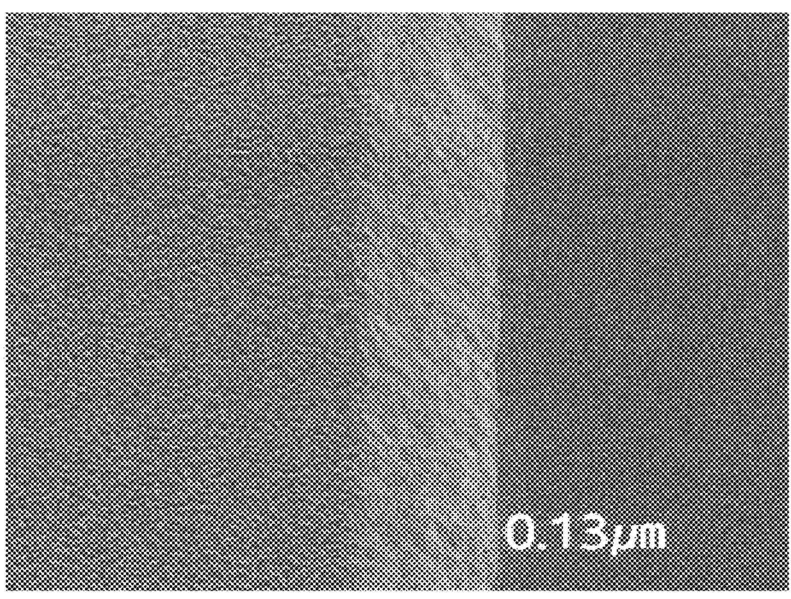
Figure 13C:
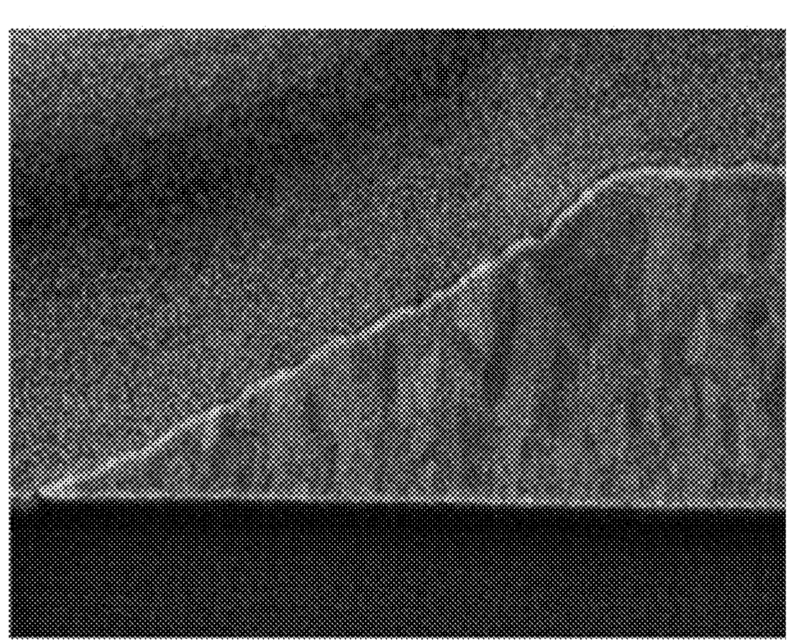
Figure 14A:
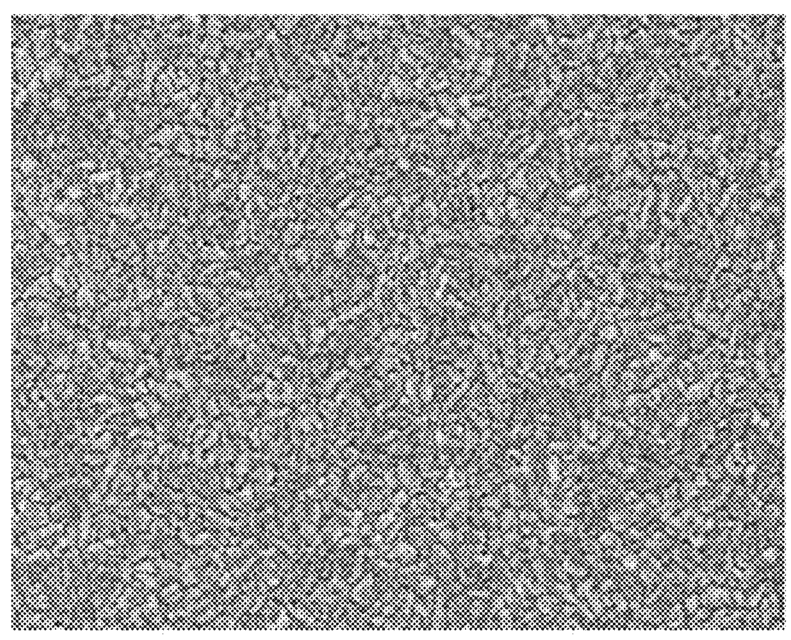
Figure 14B:
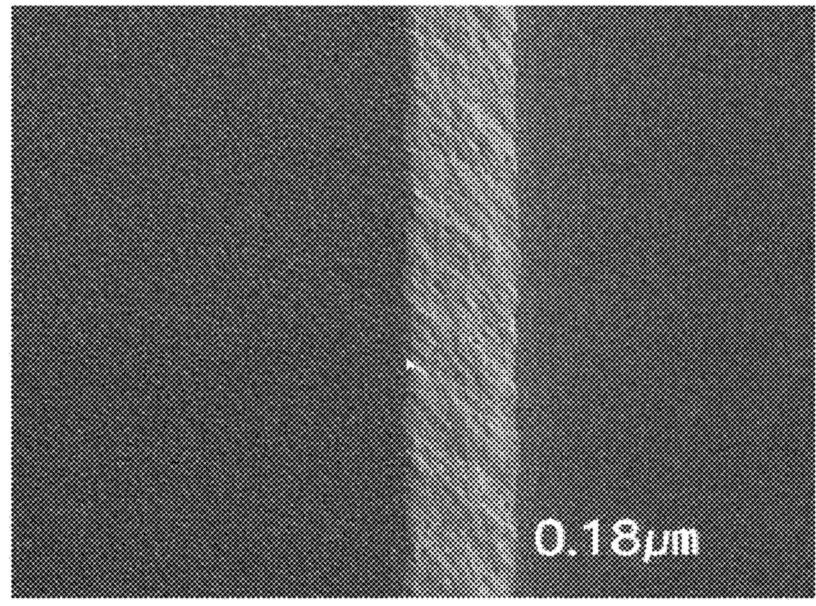
Figure 14C:
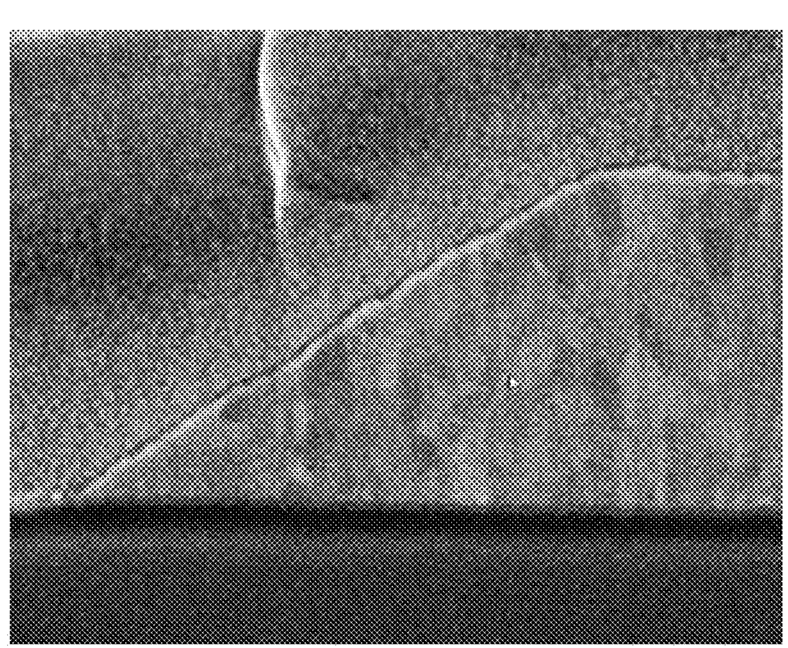

FIGS. 10A to 14C illustrate images of scanning electron microscope (SEM) and focused ion beam (FIB) showing a wire or a conductive pattern of a conductive layer. FIGS. 10A to 10C illustrate a scanning electron microscope image showing the surface and edge of a metal layer including a titanium (Ti)/copper (Cu) double film and having a thickness of 200 Å/8000 Å, and a focused ion beam image showing a cross section of the edge of the metal layer. FIGS. 11A to 11C illustrate a scanning electron microscope image showing the surface and edge of a metal layer containing copper (Cu) and having a thickness of 8,000 Å, and a focused ion beam image showing a cross section of the edge of the metal layer. FIGS. 12A to 12C illustrate a scanning electron microscope image showing the surface and edge of a metal layer containing a Cu—In alloy with an indium content of 1 at % and having a thickness of 8,000 Å, and a focused ion beam image showing a cross section of the edge of the metal layer. FIGS. 13A to 13C illustrate a scanning electron microscope image showing the surface and edge of a metal layer containing a Cu—In alloy with an indium content of 0.4 at % and having a thickness of 8,000 Å, and a focused ion beam image showing a cross section of the edge of the metal layer. FIGS. 14A-14C illustrate a scanning electron microscope image showing the surface and edge of a metal layer containing a Cu—In alloy with an indium content of 0.2 at % and having a thickness of 8,000 Å, and a focused ion beam image showing a cross section of the edge of the metal layer.

In FIGS. 10A to 14C, the images showing the surface of each metal layer show the grain size at the top of the metal layer wire, and the images showing the edge of each metal layer show the straightness of the metal layer wire at the top of the metal layer wire, and the images showing the cross section of the edge of each metal layer show the slope roughness of the metal layer wire. The straightness of the metal layer wire may be determined through a profile of the inclined side surface of the wire, i.e., a side surface inclined along the extension direction of the wire.

Referring to FIGS. 10A to 14C, the grain size of the metal layer containing copper (Cu) was about 194 nm, and the copper (Cu) grain size of the metal layer including a Ti/Cu double film was about 200 nm. On the other hand, the grain size of the metal layer containing a Cu—In alloy was about 100 nm in case that the indium content was 1 at %, about 120 nm in case that the indium content was 0.4 at %, and about 130 nm in case that the indium content was 0.2 at %.

Through this, it can be seen that the grain size of the Cu—In alloy containing indium (In) as an impurity may be smaller than that of pure Cu or a Ti/Cu double film.

The grain size of the metal layer containing copper (Cu) was about 194 nm, and the Cu grain size of the metal layer including a Ti/Cu double film was about 200 nm. On the other hand, the grain size of the metal layer containing a Cu—In alloy was about 100 nm in case that the indium content was 1 at %, about 120 nm in case that the indium content was 0.4 at %, and about 130 nm in case that the indium content was 0.2 at %. Through this, it can be seen that the grain size of the Cu—In alloy containing indium (In) as an impurity may be smaller than that of pure Cu or a Ti/Cu double film.

It can be seen that the wire made of a metal layer containing a Cu—In alloy has a smoother side surface than that of the wire made of a metal layer containing pure Cu or a Ti/Cu double film, thereby having improved straightness. In addition, it can be seen that the slope roughness of the metal layer containing a Cu—In alloy has been improved as the slope may be smoothly formed.

After forming each metal layer wire, heat treatment was performed at 350° C. for 1 hour and the resistivity was measured. The resistivity of the metal layer containing copper (Cu) was about 1.95, and the resistivity of the metal layer including a Ti/Cu double film was about 2.03. On the other hand, the resistivity of the metal layer containing a Cu—In alloy was about 2.73 in case that the indium content was 1 at %, about 2.3 when the indium content was 0.4 at %, and about 2.09 when the indium content was 0.2 at %. Through this, it can be seen that in case that indium (In) rather than pure Cu or a Ti/Cu double film may be contained as an impurity, the indium content may be equal to or less than about 0.4 at %, and the resistivity may be equal to or less than about 2.3.

In the display device 10 and the wiring substrate 101 according to one embodiment, the wires or the conductive patterns of the conductive layers may have a smooth surface, improved slope roughness, and improved wire straightness, and short circuits and burn defects that may occur in the wires may be prevented.

According to one embodiment, the metal layer ML of the wiring substrate 101 may contain a Cu—In alloy to have a grain size equal to or less than about 140 nm, a resistivity equal to or less than about 2.3 μΩcm, and a line edge roughness (LER) value equal to or less than about 0.195 μm. The metal layer ML may have a small grain size, and the LER value may also decrease. Accordingly, the metal layer ML may have a smooth surface and improved wire straightness to prevent short circuits and burn defects that may occur in the wires, and the limit of a voltage applied to the wires may be high.

Figure 15:
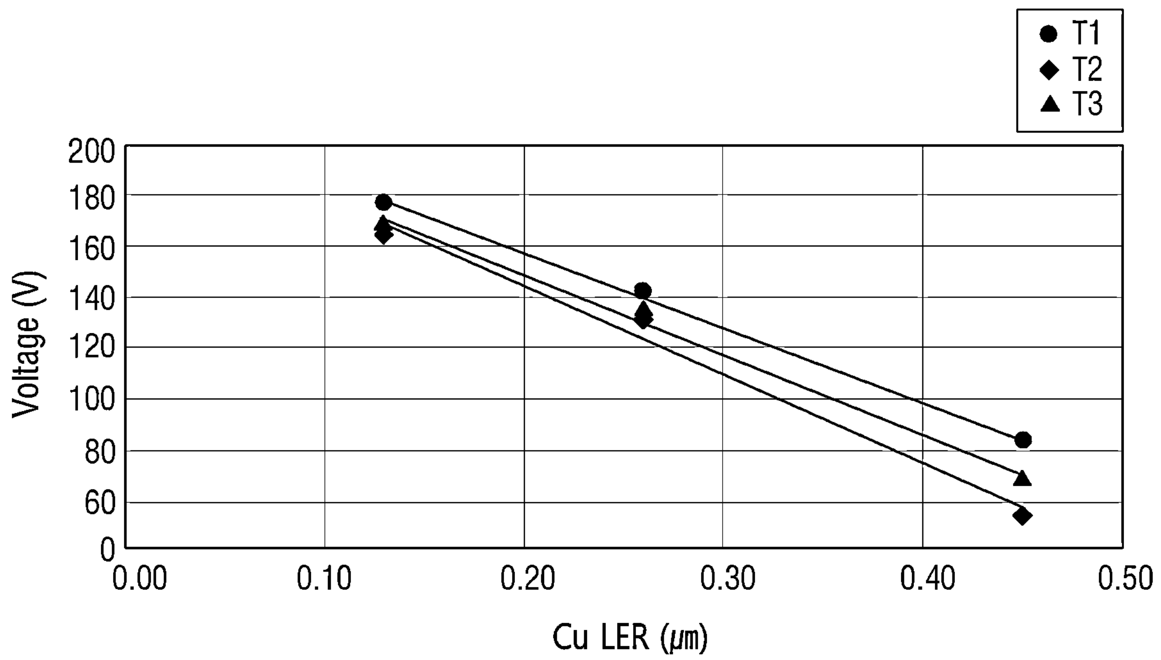
FIG. 15 is a graph illustrating a voltage limit value of a wire according to a line edge roughness (LER) value of a conductive layer according to one embodiment.

FIG. 15 is a graph illustrating a voltage limit value of a wire according to a line edge roughness (LER) value of a conductive layer according to one embodiment. The graph of FIG. 15 shows a voltage MV/cm at which an insulating layer covering the metal layer ML may be destroyed by a voltage applied to the metal layer ML according to the line edge roughness (LER) value of the metal layer ML.

Referring to FIG. 15, the metal layer ML according to one embodiment may have a line edge roughness (LER) value equal to or less than about 0.195 μm, and a voltage limit value equal to or greater than about 150V. The metal layer ML may include a Cu—In alloy to have a resistivity equal to or less than about 2.3 μΩcm and improved wire straightness, thereby improving durability against high voltage. The wiring substrate 101 according to one embodiment may include the metal layer ML to prevent damage in high voltage driving.

The line edge roughness (LER) value may be calculated by positioning a wire in the center of the image in the photo of FIG. 10A and measuring a distance from the edge of the image to the edge of the wire. For example, the line edge roughness (LER) value of the wire may be obtained by measuring the distance from the edge of the image to the edge of the wire at several places (or points) of the wire, and calculating the difference between their maximum and minimum values. In the metal layer ML according to one embodiment, in case that measuring the distance between the edge of the wire and the edge of the image at 10 points, a difference between the sum of the maximum distances of 5 points and the sum of the minimum distances of 5 points may be equal to or less than about 0.195 μm.

According to one embodiment, a thickness TH1 of the metal layer ML may be in a range of about 2,000 Å to about 20,000 Å. As the metal layer ML has a resistivity equal to or less than about 2.3 μΩcm and a thickness in the above-described range, it may have a resistance value required for the wires and the patterns of the conductive layers. For example, the metal layer ML may have resistivity equal to or less than about 2.3 μΩcm, a thickness of about 8,000 Å, e.g., in a range of about 7,500 Å to about 8,500 Å, and a sheet resistance in a range of about 0.02Ω/□ to about 0.03Ω/□. In other embodiments, the metal layer ML may have resistivity equal to or less than about 2.3 μΩcm, a thickness of about 3,000 Å, e.g., in a range of about 2,500 Å to about 3,500 Å, and a sheet resistance in a range of about 0.06Ω/□ to about 0.08Ω/□. As the metal layer ML has the thickness TH1 in the above-described range, it may have excellent physical properties as the wire of the conductive layer, and may have a grain size equal to or less than about 140 nm and a smooth surface. However, the disclosure is not limited thereto.

Hereinafter, other embodiments of the display device 10 will be described with reference to other drawings.

Figure 16:
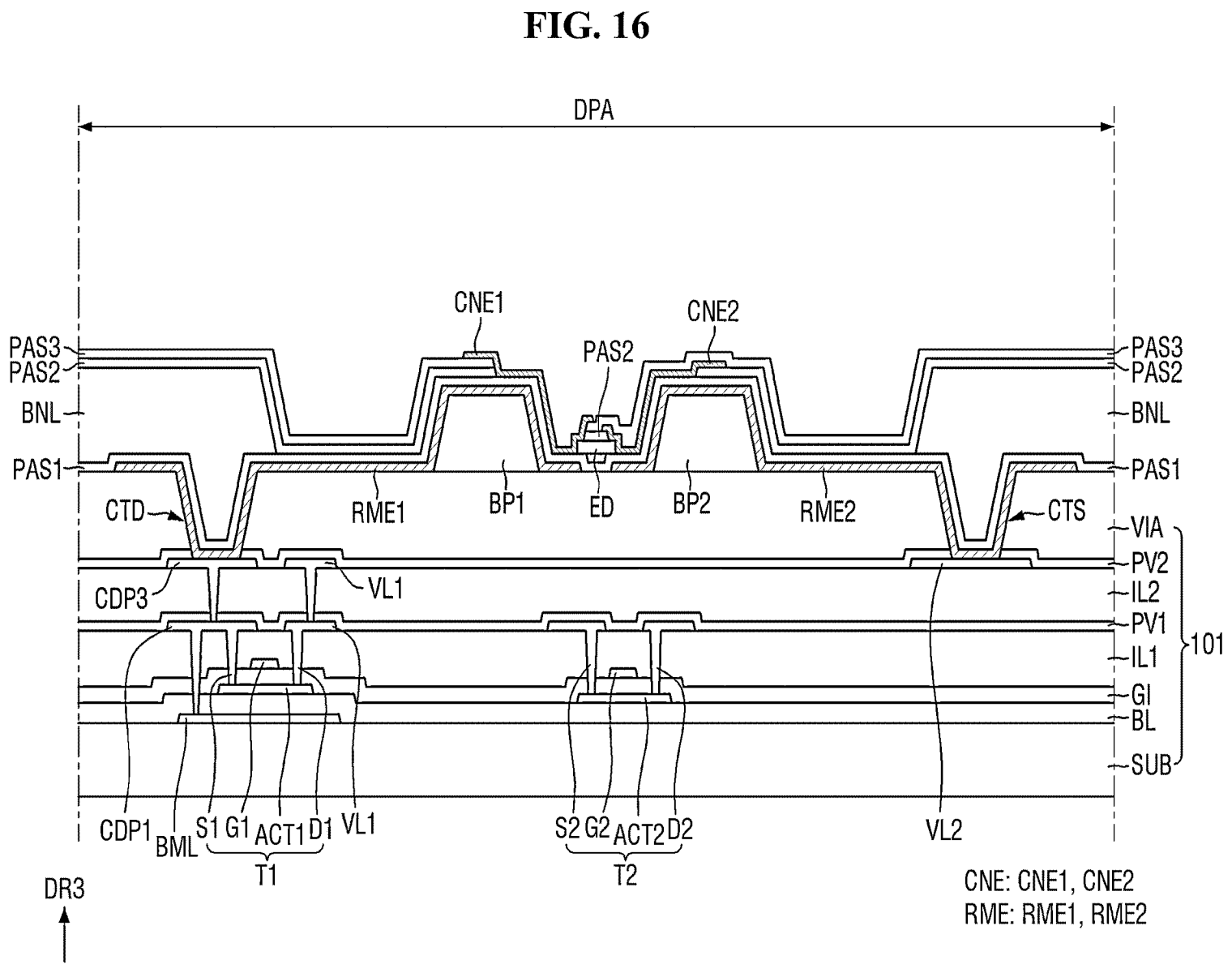

FIG. 16 is a schematic cross-sectional view illustrating a portion of a display device according to another embodiment.

Referring to FIG. 16, in the display device 10 according to one embodiment, the wiring substrate 101 may further include a second interlayer insulating layer IL2 disposed on the third conductive layer, a fourth conductive layer, and a second passivation layer PV2. The embodiment may be different from the embodiment of FIG. 5 in that the wiring substrate 101 included in the display device 10 includes a larger number of conductive layers.

The display device 10 and the wiring substrate 101 of the display device 10 may further include the second interlayer insulating layer IL2 disposed on the first passivation layer PV1, the fourth conductive layer disposed on the second interlayer insulating layer IL2, and the second passivation layer PV2 disposed on the fourth conductive layer. The via layer VIA may be disposed on the second passivation layer PV2, and each of the first electrode contact hole CTD and the second electrode contact hole CTS may penetrate the via layer VIA and the second passivation layer PV2.

The wires or the conductive patterns disposed on the third conductive layer of the embodiment of FIG. 5 may be disposed on different conductive layers. For example, the third conductive layer may include conductive patterns including the first conductive pattern CDP1 and a second conductive pattern CDP2 and serving as source electrodes and drain electrodes of the transistors T1 and T2, and the fourth conductive layer may include the first voltage line VL1, the second voltage line VL2, and a third conductive pattern CDP3.

The first conductive pattern CDP1 and the second conductive pattern CDP2 may serve as the first source electrode S1 and the first drain electrode D1 of the first transistor T1, respectively. Each of the second source electrode S2 and the second drain electrode D2 of the second transistor T2 may also be formed as the third conductive layer.

The fourth conductive layer may be disposed above the third conductive layer. The first voltage line VL1 of the fourth conductive layer may be connected to the second conductive pattern CDP2 of the third conductive layer, and the third conductive pattern CDP3 of the fourth conductive layer may be connected to the first conductive pattern CDP1 of the third conductive layer. The first voltage line VL1 may be electrically connected to the first transistor T1 through the second conductive pattern CDP2, and the first electrode RME1 may be electrically connected to the first transistor T1 through the third conductive pattern CDP3. The second electrode RME2 may be directly connected to the second voltage line VL2 of the fourth conductive layer.

Each of the third conductive layer and the fourth conductive layer may include the metal layer ML described above with reference to FIG. 8. Each of the wires or the conductive patterns of the third conductive layer and the fourth conductive layer may include the metal layers ML made of different materials and may have smooth surfaces and improved straightness.

The second interlayer insulating layer IL2 may be disposed between the third conductive layer and the fourth conductive layer. The second interlayer insulating layer IL2 may be disposed on the first passivation layer PV1 covering the third conductive layer, and the fourth conductive layer may be directly disposed on the second interlayer insulating layer IL2. Similarly to the first interlayer insulating layer ILL the second interlayer insulating layer IL2 may function as an insulating layer between the third conductive layer and the fourth conductive layer and may protect the third conductive layer.

The second passivation layer PV2 may be disposed on the fourth conductive layer. The second passivation layer PV2 may function as an insulating layer between the fourth conductive layer and other layers and may protect the fourth conductive layer.

Figure 17:
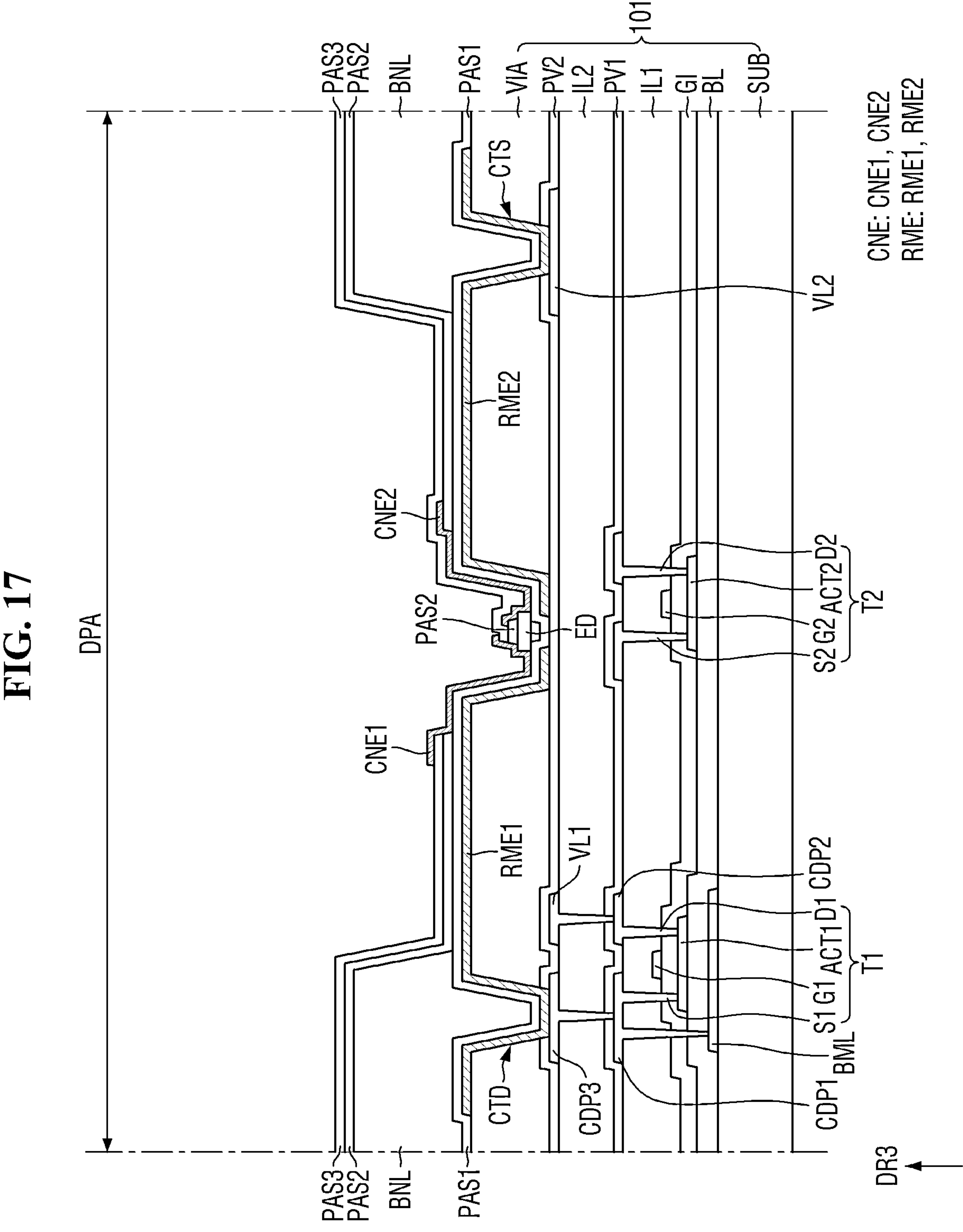
FIG. 17 is a schematic cross-sectional view illustrating a portion of a display device according to still another embodiment.

FIG. 17 is a schematic cross-sectional view illustrating a portion of a display device according to still another embodiment.

Referring to FIG. 17, in the display device 10 according to one embodiment, the bank patterns BP1 and BP2 disposed on the via layer VIA may be omitted, and the via layer VIA may have trenches in which the light emitting elements ED may be disposed. The electrodes RME1 and RME2 and the first insulating layer PAS1 may be disposed in the trenches of the via layer VIA, and the light emitting elements ED may also be disposed on the first insulating layer PAS1 in the trenches. The trenches of the via layer VIA may form inclined sidewalls instead of the bank patterns BP1 and BP2, and the electrodes RME1 and RME2 may be disposed on the inclined sidewalls of the trenches so that the lights emitted from the light emitting element ED may be emitted in the upward direction.

The trenches formed in the via layer VIA may penetrate the via layer VIA, similarly to the electrode contact holes CTD and CTS. The trenches of the via layer VIA may expose the top surface of the second passivation layer PV2 under the via layer VIA, and the electrodes RME1 and RME2 and the first insulating layer PAS1 may be partially disposed directly on the second passivation layer PV2.

The embodiment of FIG. 17 may be different from the embodiment of FIG. 16 in that the bank patterns BP1 and BP2 may be omitted and the via layer VIA has the trenches in which the light emitting elements ED may be disposed instead of the bank patterns BP1 and BP2. The other descriptions may be the same as the above description.

Figure 18:
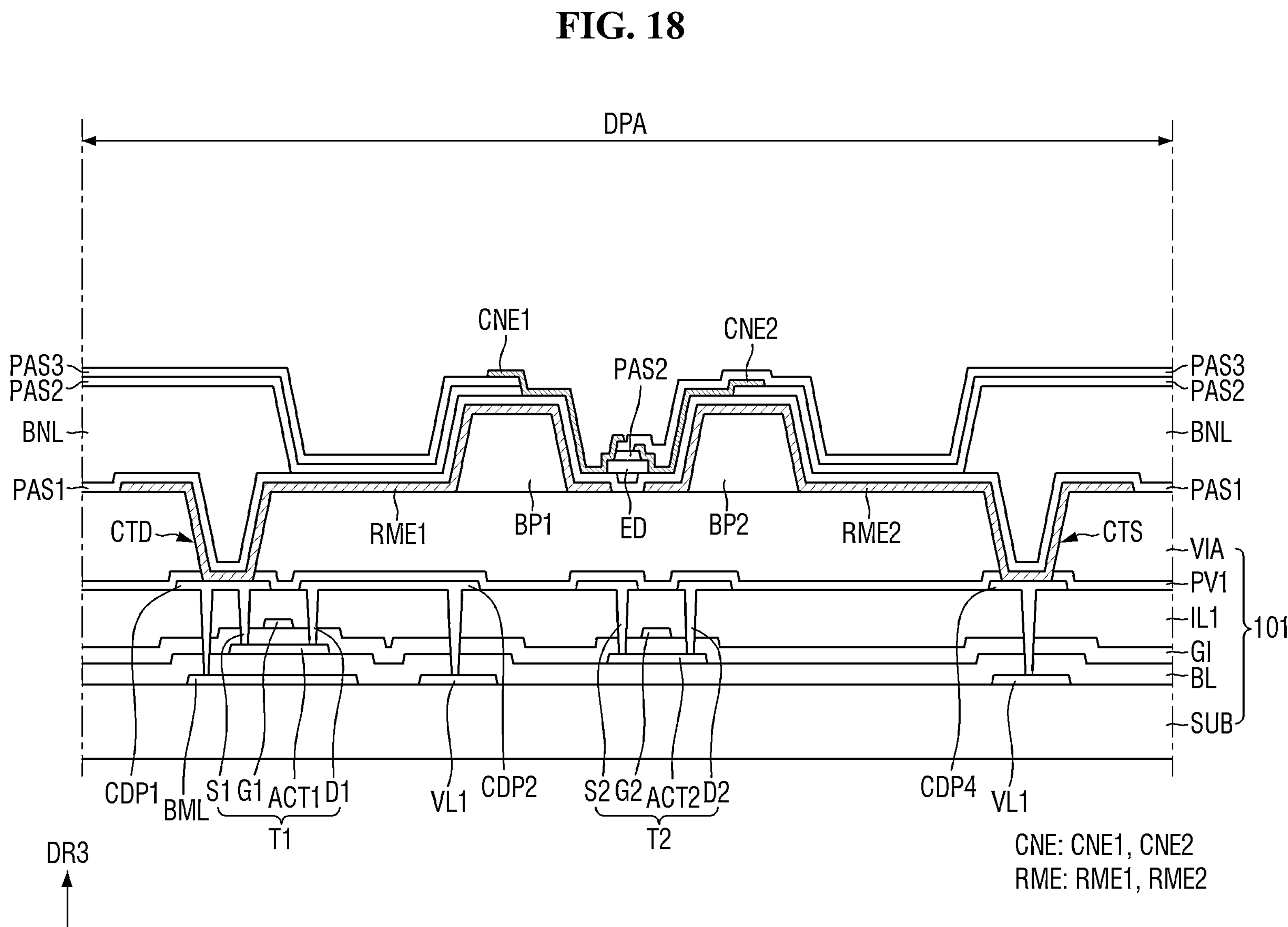
FIG. 18 is a schematic cross-sectional view illustrating a portion of a display device according to still another embodiment.

FIG. 18 is a schematic cross-sectional view illustrating a portion of a display device according to still another embodiment.

Referring to FIG. 18, in the display device 10 according to one embodiment, each of the first voltage line VL1 and the second voltage line VL2 may be formed as the first conductive layer, and the third conductive layer may further include the second conductive pattern CDP2 and the fourth conductive pattern CDP4. The embodiment may be different from the embodiment of FIG. 5 in that the first voltage line VL1 and the second voltage line VL2 may be formed as the first conductive layer, not as the third conductive layer, and the second conductive pattern CDP2 and the fourth conductive pattern CDP4 electrically connecting them to the first transistor T1 or the second electrode RME2 may be further included.

Each of the first voltage line VL1 and the second voltage line VL2 may be formed as the first conductive layer, and may include the metal layer ML as described above. A detailed description thereof may be the same as described above with reference to FIG. 8.

The third conductive layer may include the second conductive pattern CDP2 connected to the first voltage line VL1. The second conductive pattern CDP2 may serve as the first drain electrode D1 of the first transistor T1 and may be directly connected to the first voltage line VL1. The first voltage line VL1 may be electrically connected to the first transistor T1 through the second conductive pattern CDP2. Further, the third conductive layer may include the fourth conductive pattern CDP4 connected to the second voltage line VL2. The fourth conductive pattern CDP4 may be connected to each of the second electrode RME2 and the second voltage line VL2, and the second electrode RME2 may be electrically connected to the second voltage line VL2 through the fourth conductive pattern CDP4.

Each of the second conductive pattern CDP2 and the fourth conductive pattern CDP4 may also include the metal layer ML. A detailed description thereof may be the same as described above with reference to FIGS. 5 to 8.

Figure 19:
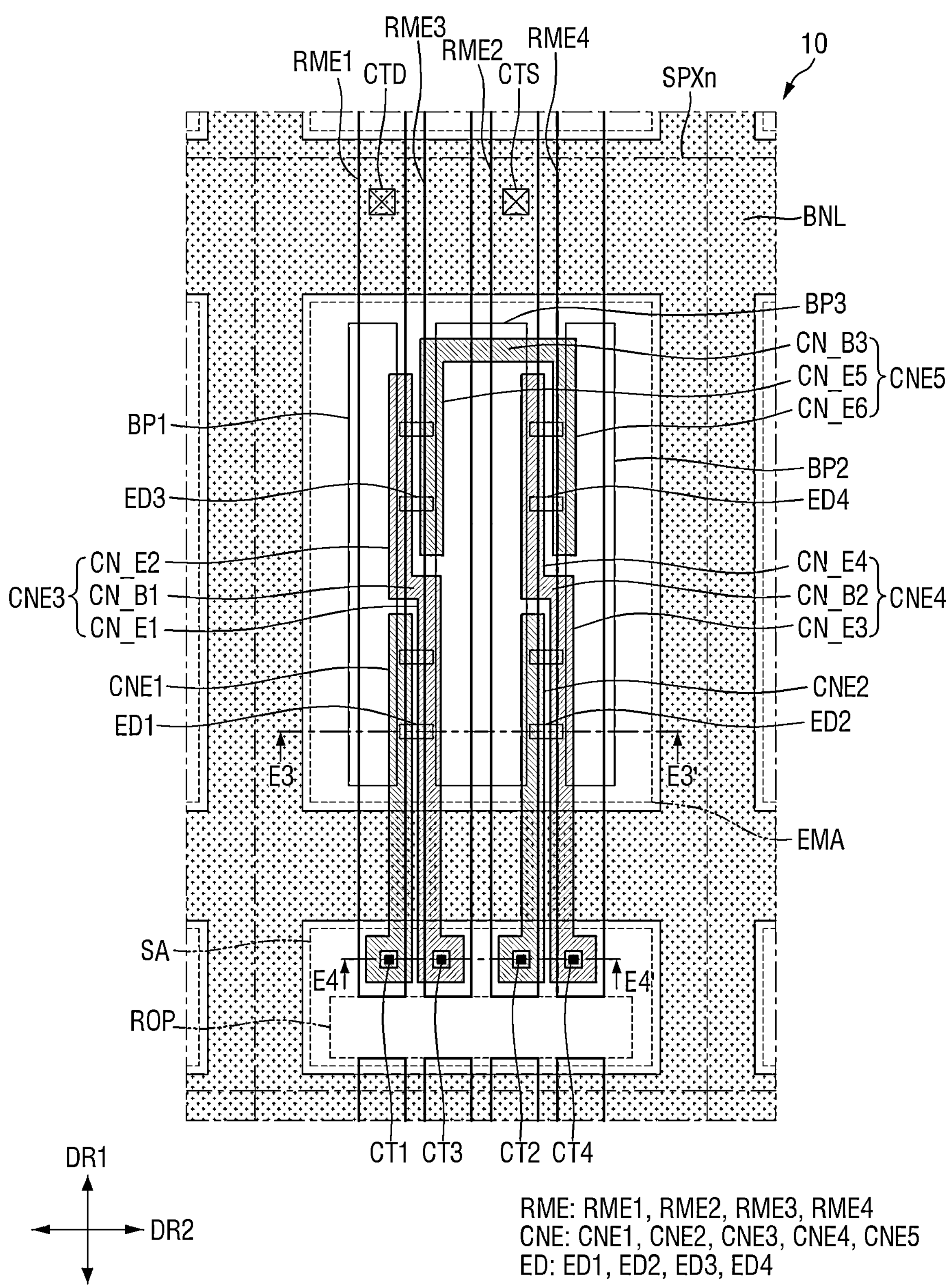
FIG. 19 is a schematic plan view illustrating a sub-pixel of a display device according to another embodiment.
Figure 20:
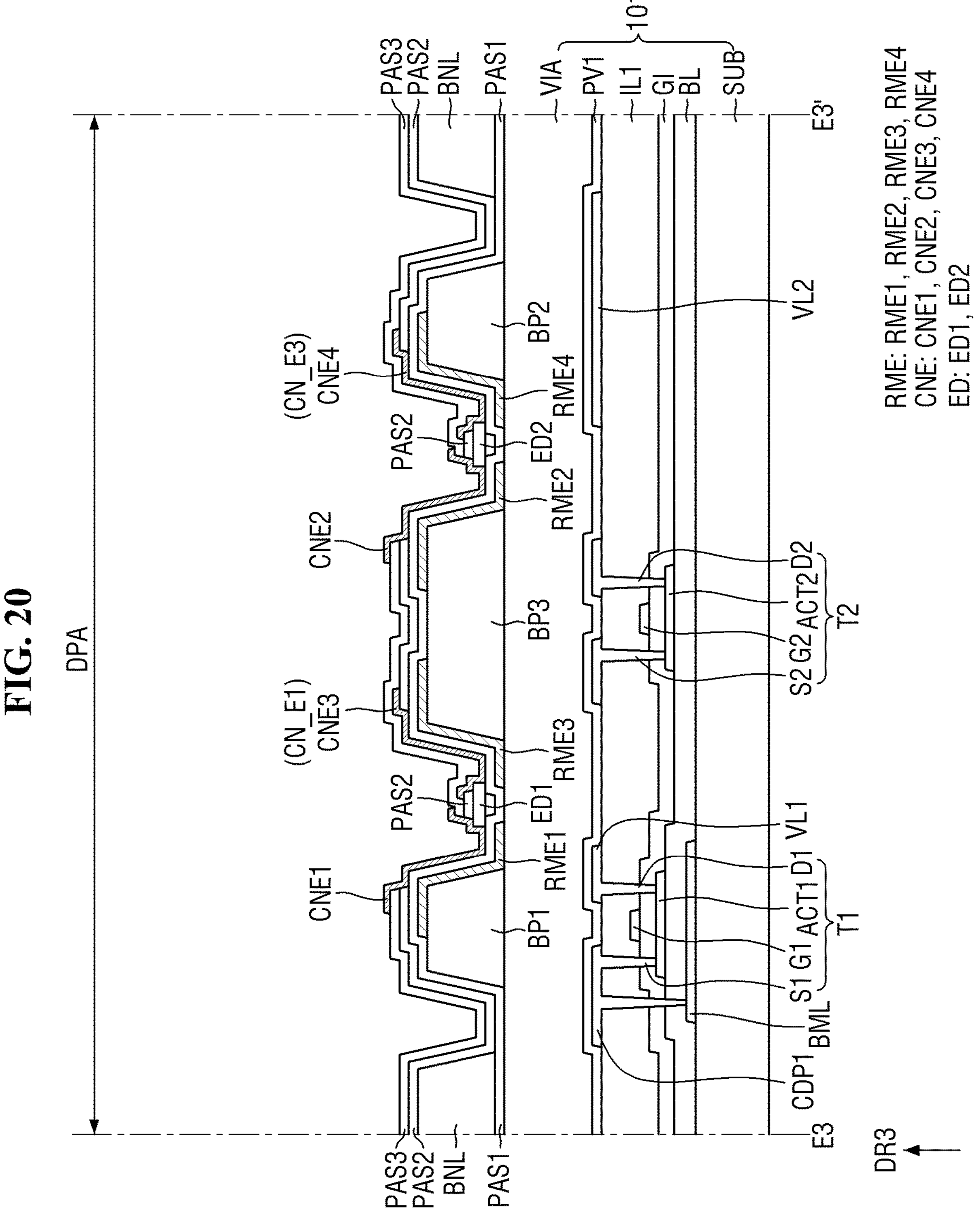
FIG. 20 is a schematic cross-sectional view taken along line E3-E3' in FIG. 19.
Figure 21:
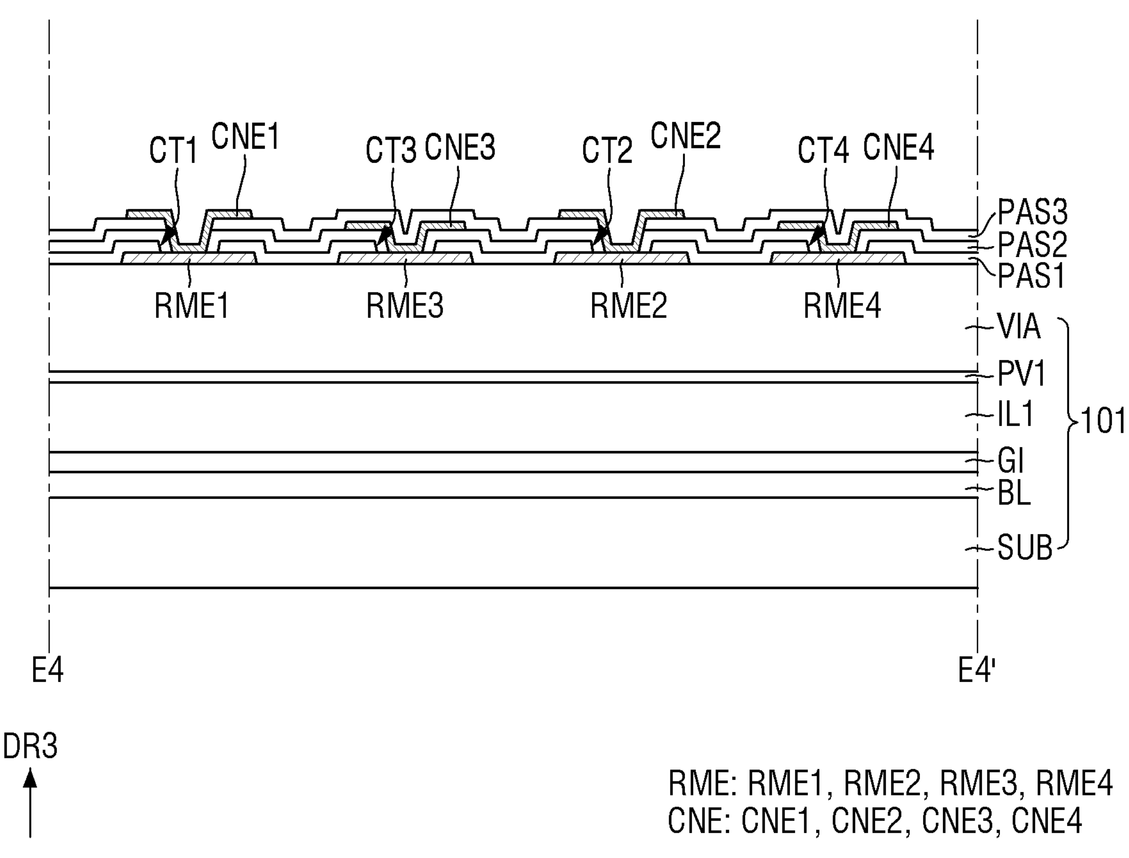
FIG. 21 is a schematic cross-sectional view taken along line E4-E4' in FIG. 19.

FIG. 19 is a schematic plan view illustrating a sub-pixel of a display device according to another embodiment. FIG. 20 is a schematic cross-sectional view taken along line E3-E3' in FIG. 19. FIG. 21 is a schematic cross-sectional view taken along line E4-E4' in FIG. 19. FIG. 19 illustrates planar arrangement of electrodes RME (RME1, RME2, RME3, and RME4), bank patterns BP1, BP2, and BP3, the bank layer BNL, the light emitting elements ED, connection electrodes CNE (CNE1, CNE2, CNE3, CNE4, and CNE5) disposed in one pixel PX of the display device 10. FIG. 20 illustrates a cross section across both ends of the light emitting elements ED (ED1, ED2, ED3, and ED4) disposed on different electrodes RME, and FIG. 21 illustrates a cross section across contact portions CT1, CT2, CT3, and CT4.

Referring to FIGS. 19 to 21, the display device 10 according to one embodiment may include a larger number of electrodes RME (RME1, RME2, RME3, and RME4), bank patterns BP1, BP2, and BP3, light emitting elements ED (ED1, ED2, ED3, and ED4) and connection electrodes CNE (CNE1, CNE2, CNE3, CNE4, and CNE5). The display device 10 according to the embodiment may be different from the embodiment of FIG. 4 in that a larger number of electrodes and a larger number of light emitting elements may be included in each sub-pixel SPXn. In the following description, redundant description will be omitted while focusing on differences.

The bank patterns BP1, BP2, and BP3 may further include a third bank pattern BP3 disposed between the first bank pattern BP1 and the second bank pattern BP2. The first bank pattern BP1 may be located on the left side with respect to the center of the emission area EMA, the second bank pattern BP2 may be located on the right side with respect to the center of the emission area EMA, and the third bank pattern BP3 may be located at the center of the emission area EMA. The width of the third bank pattern BP3 measured in the second direction DR2 may be greater than those of the first bank pattern BP1 and the second bank pattern BP2 measured in the second direction DR2. The gap between the bank patterns BP1, BP2, and BP3 in the second direction DR2 may be greater than the gap between the electrodes RME. The first bank pattern BP1 may be disposed to partially overlap the first electrode RME1, and the second bank pattern BP2 may be disposed to partially overlap the fourth electrode RME4. The third bank pattern BP3 may be disposed to partially overlap the second electrode RME2 and the third electrode RME3. At least portions of the electrodes RME may be arranged without overlapping the bank patterns BP1, BP2, and BP3.

The electrodes RME arranged for each sub-pixel SPXn may further include a third electrode RME3 and a fourth electrode RME4 in addition to a first electrode RME1 and a second electrode RME2.

The third electrode RME3 may be disposed between the first electrode RME1 and the second electrode RME2, and the fourth electrode RME4 may be spaced apart from the third electrode RME3 in the second direction DR2 with the second electrode RME2 interposed therebetween. The electrodes RME may be sequentially arranged in the order of the first electrode RME1, the third electrode RME3, the second electrode RME2, and the fourth electrode RME4 from the left side to the right side of the sub-pixel SPXn. The electrodes RME may face and be spaced apart from each other in the second direction DR2. The electrodes RME may be spaced apart from the electrodes RME of another sub-pixel SPXn adjacent in the first direction DR1 at the separation portion ROP of the sub-region SA.

Among the electrodes RME, the first electrode RME1 and the second electrode RME2 may contact the first conductive pattern CDP1 and the second voltage line VL2 disposed thereunder through the electrode contact holes CTD and CTS disposed under the bank layer BNL, respectively, whereas the third electrode RME3 and the fourth electrode RME4 may not contact them.

The first insulating layer PAS1 may be disposed in a structure similar to that in the above-described embodiments. The first insulating layer PAS1 may be disposed in the entire display area DPA and may cover the electrodes RME and the bank patterns BP1, BP2, and BP3.

The light emitting elements ED may be arranged between the bank patterns BP1, BP2, and BP3 or on different electrodes RME. Some of the light emitting elements ED may be arranged between the first bank pattern BP1 and the third bank pattern BP3, and some other light emitting elements ED may be arranged between the third bank pattern BP3 and the second bank pattern BP2. In accordance with one embodiment, the light emitting element ED may include a first light emitting element ED1 and a third light emitting element ED3 arranged between the first bank pattern BP1 and the third bank pattern BP3, and a second light emitting element ED2 and a fourth light emitting element ED4 arranged between the third bank pattern BP3 and the second bank pattern BP2. Each of the first light emitting element ED1 and the third light emitting element ED3 may be disposed above the first electrode RME1 and the third electrode RME3, and each of the second light emitting element ED2 and the fourth light emitting element ED4 may be disposed above the second electrode RME2 and the fourth electrode RME4. The first light emitting element ED1 and the second light emitting element ED2 may be arranged adjacent to the lower side of the emission area EMA of the corresponding sub-pixel SPXn or adjacent to the sub-region SA, and the third light emitting element ED3 and the fourth light emitting element ED4 may be arranged adjacent to the upper side of the emission area EMA of the corresponding sub-pixel SPXn.

However, the light emitting elements ED may not be classified according to the arrangement position in the emission area EMA, but may be classified according to a connection relationship with the connection electrode CNE, which will be described later. Both ends of each light emitting element ED may be in contact with different connection electrodes CNE according to an arrangement method of the connection electrodes CNE. The light emitting elements ED may be classified into different types of light emitting elements ED according to the type of the connection electrode CNE in contact therewith.

The connection electrodes CNE may further include, in addition to the first connection electrode CNE1 disposed on the first electrode RME1, the second connection electrode CNE2 disposed on the second electrode RME2, a third connection electrode CNE3, a fourth connection electrode CNE4, and a fifth connection electrode CNE5 arranged across the electrodes RME.

Unlike the embodiment of FIGS. 4 to 6, each of the first connection electrode CNE1 and the second connection electrode CNE2 may have a relatively short length extending in the first direction DR1. The first connection electrode CNE1 and the second connection electrode CNE2 may be arranged on the lower side with respect to the center of the emission area EMA. The first connection electrode CNE1 and the second connection electrode CNE2 may be disposed across the emission area EMA and the sub-region SA of the corresponding sub-pixel SPXn, and may directly contact the electrode RME through the contact portions CT1 and CT2 formed in the sub-region SA, respectively. The first connection electrode CNE1 may directly contact the first electrode RME1 through the first contact portion CT1 penetrating the first insulating layer PAS1, the second insulating layer PAS2, and the third insulating layer PAS3 in the sub-region SA, and the second connection electrode CNE2 may directly contact the second electrode RME2 through the second contact portion CT2 penetrating the first insulating layer PAS1, the second insulating layer PAS2, and the third insulating layer PAS3 in the sub-region SA.

The third connection electrode CNE3 may include a first extension portion CN_E1 disposed on the third electrode RME3, a second extension portion CN_E2 disposed on the first electrode RME1, and a first connection portion CN_B1 that connects the first extension portion CN_E1 to the second extension portion CN_E2. The first extension portion CN_E1 may be spaced apart from the first connection electrode CNE1 in the second direction DR2, and the second extension portion CN_E2 may be spaced apart from the first connection electrode CNE1 in the first direction DR1. The first extension portion CN_E1 may be disposed on the lower side of the emission area EMA of the corresponding sub-pixel SPXn, and the second extension portion CN_E2 may be disposed on the upper side of the emission area EMA. The first extension portion CN_E1 and the second extension portion CN_E2 may be disposed in the emission area EMA. The first connection portion CN_B1 may be disposed across the first electrode RME1 and the third electrode RME3 at the central portion of the emission area EMA. The third connection electrode CNE3 may have a shape substantially extending in the first direction DR1, and may have a shape that is bent in the second direction DR2 and extends in the first direction DR1 again.

The fourth connection electrode CNE4 may include a third extension portion CN_E3 disposed on the fourth electrode RME4, a fourth extension portion CN_E4 disposed on the second electrode RME2, and a second connection portion CN_B2 that connects the third extension portion CN_E3 to the fourth extension portion CN_E4. The third extension portion CN_E3 may face and be spaced apart from the second connection electrode CNE2 in the second direction DR2, and the fourth extension portion CN_E4 may be spaced apart from the second connection electrode CNE2 in the first direction DR1. The third extension portion CN_E3 may be disposed on the lower side of the emission area EMA of the corresponding sub-pixel SPXn, and the fourth extension portion CN_E4 may be disposed on the upper side of the emission area EMA. The third extension portion CN_E3 and the fourth extension portion CN_E4 may be disposed in the emission area EMA. The second connection portion CN_B2 may be disposed across the second electrode RME2 and the fourth electrode RME4 while being adjacent to the center of the emission area EMA. The fourth connection electrode CNE4 may have a shape substantially extending in the first direction DR1, and may have a shape that is bent in the second direction DR2 and extends in the first direction DR1 again.

The fifth connection electrode CNE5 may include a fifth extension portion CN_E5 disposed on the third electrode RME3, a sixth extension portion CN_E6 disposed on the fourth electrode RME4, and a third connection portion CN_B3 that connects the fifth extension portion CN_E5 to the sixth extension portion CN_E6. The fifth extension portion CN_E5 may face and be spaced apart from the second extension portion CN_E2 of the third connection electrode CNE3 in the second direction DR2, and the sixth extension portion CN_E6 may face and be spaced apart from the fourth extension portion CN_E4 of the fourth connection electrode CNE4 in the second direction DR2. Each of the fifth extension portion CN_E5 and the sixth extension portion CN_E6 may be arranged on the upper side of the emission area EMA, and the third connection portion CN_B3 may be disposed across the third electrode RME3, the second electrode RME2, and the fourth electrode RME4. The fifth connection electrode CNE5 may be disposed to surround the fourth extension portion CN_E4 of the fourth connection electrode CNE4 in a plan view.

The third connection electrode CNE3 may directly contact the third electrode RME3 through the third contact portion CT3 penetrating the first insulating layer PAS1 and the second insulating layer PAS2 in the sub-region SA, and the fourth connection electrode CNE4 may directly contact the fourth electrode RME4 through the fourth contact portion CT4 penetrating the first insulating layer PAS1 and the second insulating layer PAS2 in the sub-region SA.

However, the disclosure is not limited thereto. In some embodiments, in the display device 10, some of the connection electrodes CNE may be directly connected to the third conductive layer. For example, the first connection electrode CNE1 and the second connection electrode CNE2 that are first type connection electrodes may be directly connected to the third conductive layer and may not be electrically connected to the electrode RME. A second type connection electrode and a third type connection electrode may not be electrically connected to the electrode RME, and may be connected only to the light emitting elements ED.

The first connection electrode CNE1 and the second connection electrode CNE2 may be the first type connection electrodes connected to the electrodes RME1 and RME2 directly connected to the third conductive layer, respectively. The third connection electrode CNE3 and the fourth connection electrode CNE4 may be the second type connection electrodes connected to the electrodes RME3 and RME4 that may not be connected to the third conductive layer. The fifth connection electrode CNE5 may be the third type connection electrode that may not be connected to the electrode RME. The fifth connection electrode CNE5 may contact the light emitting elements ED without being connected to the electrode RME and may constitute an electrical connection circuit of the light emitting elements ED together with other connection electrodes CNE.

The third connection electrode CNE3 and the fourth connection electrode CNE4 that are the second type connection electrodes may be connection electrodes in which electrode extension portions extending in the first direction DR1 are not parallel with each other in the second direction DR2. The fifth connection electrode CNE5 that is the third type connection electrode may be the connection electrode in which electrode extension portions extending in the first direction DR1 are parallel with each other in the second direction DR2. The third connection electrode CNE3 and the fourth connection electrode CNE4 may have a shape that may be bent while extending in the first direction DR1, and the fifth connection electrode CNE5 may have a shape surrounding a portion of another connection electrode.

The light emitting elements ED may be classified into different light emitting elements ED depending on the connection electrodes CNE which contact both ends of the light emitting elements ED to correspond to the arrangement structure of the connection electrodes CNE. The first light emitting element ED1 and the second light emitting element ED2 may have first ends which contact the first type connection electrodes and second ends which contact the second type connection electrodes. The first light emitting element ED1 may contact the first connection electrode CNE1 and the third connection electrode CNE3, and the second light emitting element ED2 may contact the second connection electrode CNE2 and the fourth connection electrode CNE4. The third light emitting element ED3 and the fourth light emitting element ED4 may have first ends which contact the second type connection electrodes and second ends which contact the third type connection electrodes. The third light emitting element ED3 may contact the third connection electrode CNE3 and the fifth connection electrode CNE5, and the fourth light emitting element ED4 may contact the fourth connection electrode CNE4 and the fifth connection electrode CNE5.

The light emitting elements ED may be connected in series through the connection electrodes CNE. Since the display device 10 according to the embodiment includes a larger number of light emitting elements ED for each sub-pixel SPXn and the light emitting elements ED may be connected in series, the light emission amount per unit area may be further increased.

Figure 22:
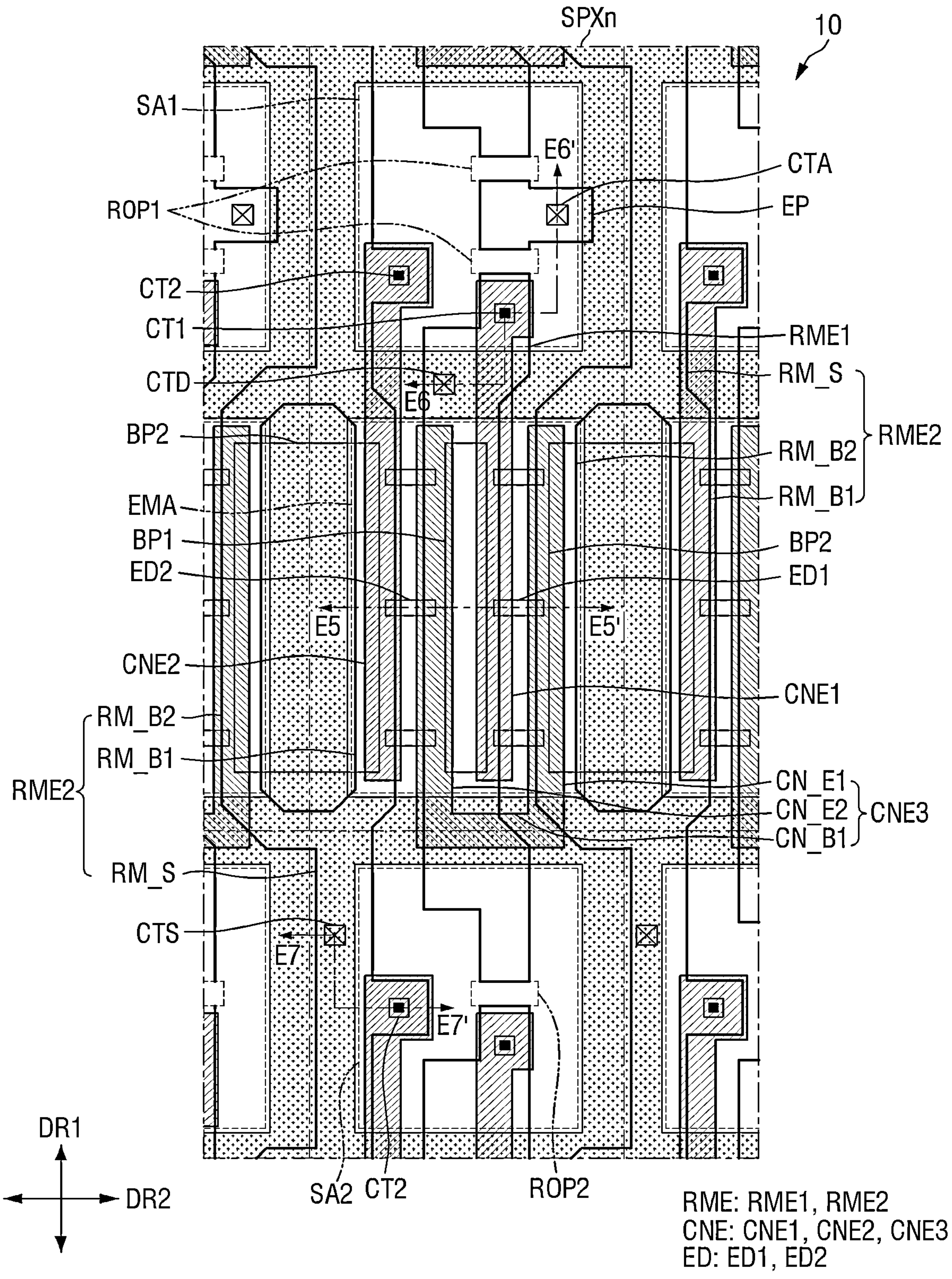
FIG. 22 is a schematic plan view illustrating a sub-pixel of a display device according to still another embodiment.
Figure 23:
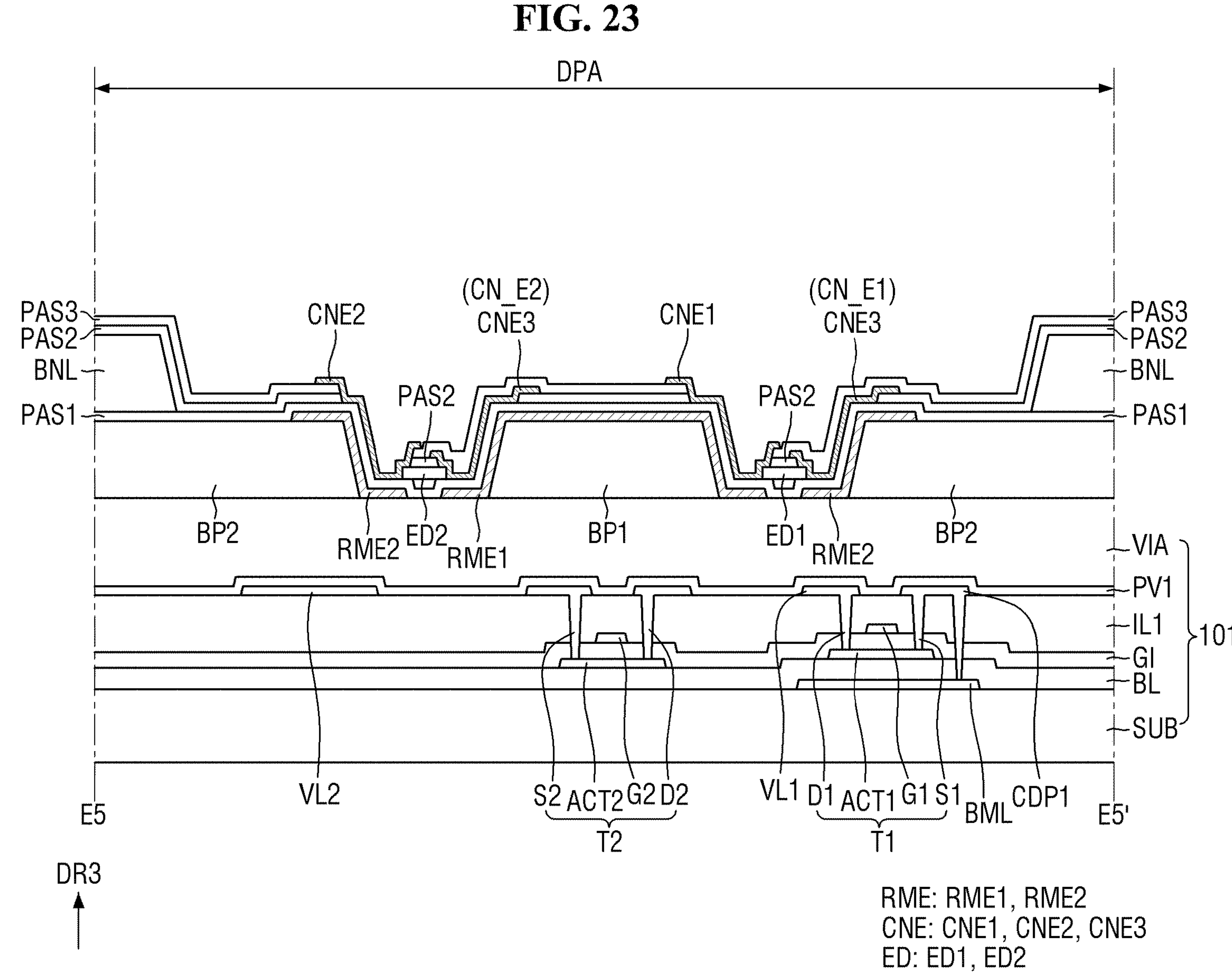
FIG. 23 is a schematic cross-sectional view taken along line E5-E5' of FIG. 22.
Figure 24:
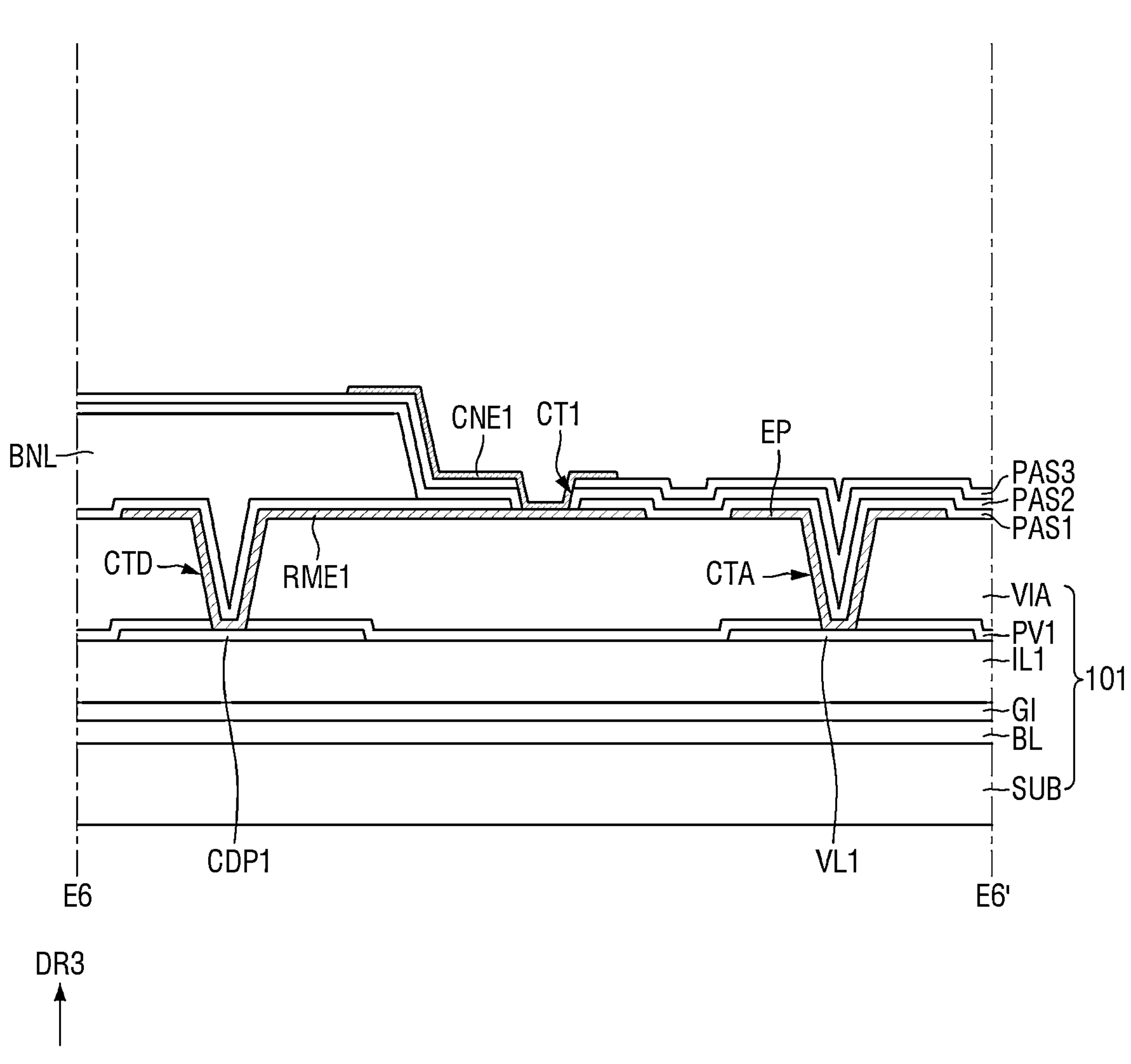
FIG. 24 is a schematic cross-sectional view taken along line E6-E6' of FIG. 22.
Figure 25:
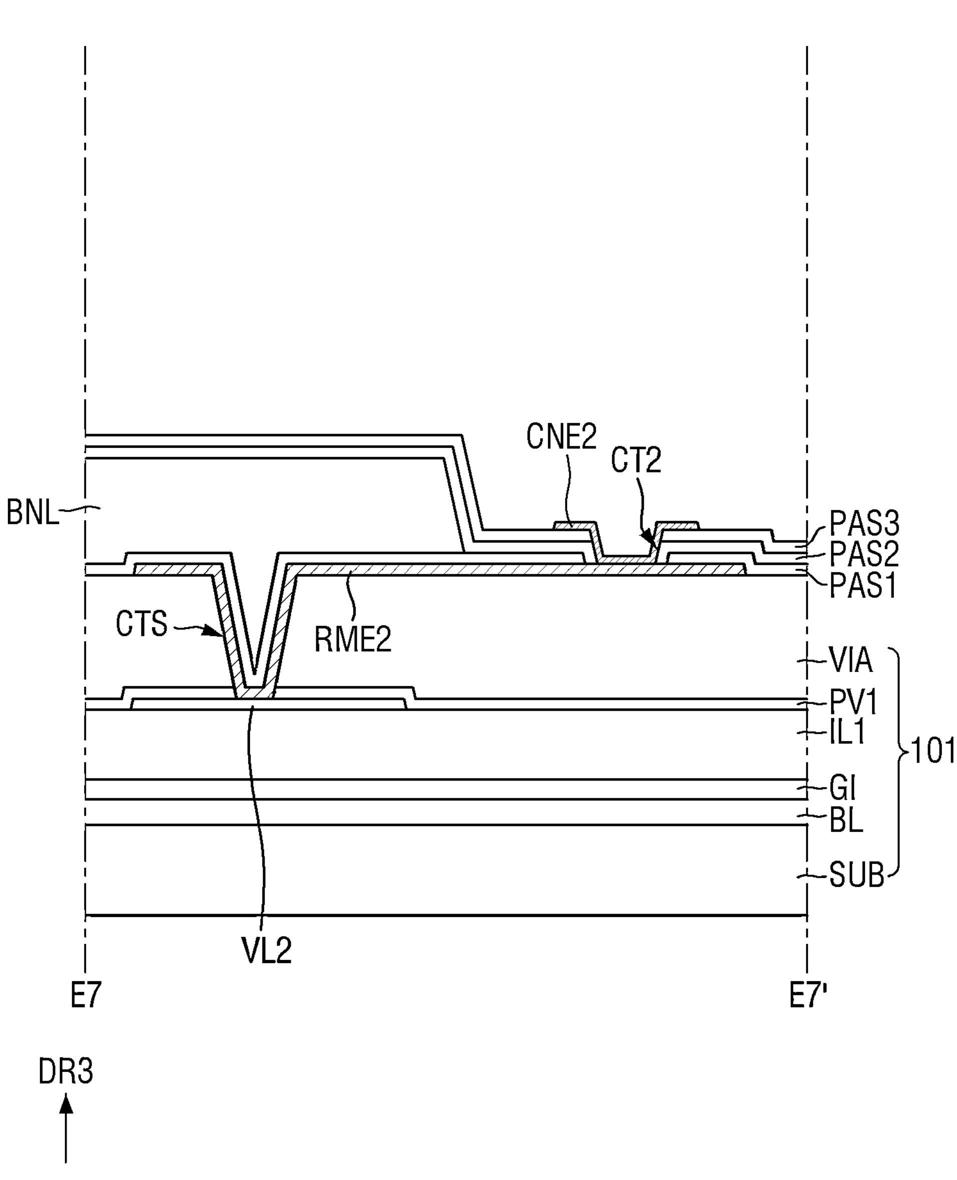
FIG. 25 is a schematic cross-sectional view taken along line E7-E7' in FIG. 22.

FIG. 22 is a schematic plan view illustrating a sub-pixel of a display device according to still another embodiment. FIG. 23 is a schematic cross-sectional view taken along line E5-E5' of FIG. 22. FIG. 24 is a schematic cross-sectional view taken along line E6-E6' of FIG. 22. FIG. 25 is a schematic cross-sectional view taken along line E7-E7' in FIG. 22.

FIG. 22 illustrates planar arrangement of the electrodes RME (RME1 and RME2), the bank patterns BP1 and BP2, the bank layer BNL, the light emitting elements ED, and the connection electrodes CNE (CNE1, CNE2, and CNE3) disposed in one pixel PX of the display device 10. FIG. 23 illustrates a cross section across both ends of the light emitting elements ED (ED1 and ED2) disposed on different electrodes RME. FIGS. 24 and 25 illustrate cross sections across electrode contact holes CTD, CTS, and CTA, and the contact portions CT1 and CT2.

Referring to FIGS. 22 to 25, in the display device 10 according to one embodiment, the structures of the electrode RME, the connection electrode CNE, and the bank patterns BP1 and BP2 may be different from those in the above-described embodiments. Hereinafter, the redundant description of the above-described embodiments will be omitted while focusing on differences.

The bank patterns BP1 and BP2 may have a shape extending in the first direction DR1, and may have different widths measured in the second direction DR2. Any one of the bank patterns BP1 and BP2 may be disposed across the sub-pixels SPXn adjacent in the second direction DR2. For example, the bank patterns BP1 and BP2 may include the first bank pattern BP1 disposed in the emission area EMA of each sub-pixel SPXn and the second bank pattern BP2 disposed across the emission areas EMA of different sub-pixels SPXn.

The first bank pattern BP1 may be disposed in the center of the emission areas EMA, and the second bank patterns BP2 may be disposed to be spaced apart from the first bank pattern BP1 interposed therebetween. The first bank pattern BP1 and the second bank pattern BP2 may be alternately disposed along the second direction DR2. The light emitting elements ED may be disposed between the first bank pattern BP1 and the second bank pattern BP2 that may be spaced apart from each other.

The first bank pattern BP1 and the second bank pattern BP2 may have the same length in the first direction DR1, but may have different widths measured in the second direction DR2. In the bank layer BNL, a portion extending in the first direction DR1 may overlap the second bank pattern BP2 in the thickness direction. The first bank pattern BP1 may be disposed to overlap the first electrode RME1, and the second bank pattern BP2 may be disposed to overlap electrode branch portions RM_B1 and RM_B2 of the second electrode RME2 and the bank layer BNL.

The first bank pattern BP1 and the second bank pattern BP2 may have the same length in the first direction DR1, but may have different widths measured in the second direction DR2. In the bank layer BNL, a portion extending in the first direction DR1 may overlap the second bank pattern BP2 in the thickness direction. The bank patterns BP1 and BP2 may be disposed in an island-like pattern on the entire surface of the display area DPA.

The electrodes RME include the first electrode RME1 disposed at the central portion of each sub-pixel SPXn and the second electrode RME2 disposed across different sub-pixels SPXn. The first electrode RME1 and the second electrode RME2 may substantially have a shape extending in the first direction DR1, and the portions of the first electrode RME1 and the second electrode RME2 disposed in the emission area EMA may have different shapes.

The first electrode RME1 may be disposed at the center of the sub-pixel SPXn, and the portion of the first electrode RME1 disposed in the emission area EMA may be disposed on the first bank pattern BP1. The first electrode RME1 may extend from the sub-region SA in the first direction DR1 to the sub-region SA of another sub-pixel SPXn. The first electrode RME1 may have a shape in which the width measured in the second direction DR2 changes depending on positions, and at least a portion of the first electrode RME1 overlapping the first bank pattern BP1 in the emission area EMA may have a width greater than that of the first bank pattern BP1.

The second electrode RME2 may include a portion extending in the first direction DR1 and portions branched near the emission area EMA. In one embodiment, the second electrode RME2 may include an electrode stem portion RM_S extending in the first direction DR1, the electrode branch portions RM_B1 and RM_B2 branched from the electrode stem portion RM_S to be bent in the second direction DR2 and extending in the first direction DR1 again. The electrode stem portion RM_S may be disposed to overlap the portion of the bank layer BNL extending in the first direction DR1, and may be disposed at one side in the second direction DR2 of the sub-region SA. The electrode branch portions RM_B1 and RM_B2 may be branched from the electrode stem portion RM_S disposed at the portion of the bank layer BNL extending in the first direction DR1 and the portion of the bank layer BNL extending in the second direction DR2, and may be bent toward both sides in the second direction DR2. The electrode branch portions RM_B1 and RM_B2 may be disposed across the emission area EMA in the first direction DR1, and may be bent again to be integrally connected to the electrode stem portion RM_S. That is, the electrode branch portions RM_B1 and RM_B2 of the second electrode RME2 may be branched on the upper side of the emission area EMA of any one sub-pixel SPXn, and may be connected to each other again on the lower side thereof.

The second electrode RME2 may include a first electrode branch portion RM_B1 disposed on the left side of the first electrode RME1 and a second electrode branch portion RM_B2 disposed on the right side of the first electrode RME1. The electrode branch portions RM_B1 and RM_B2 included in one second electrode RME2 may be disposed in the emission areas EMA of the sub-pixels SPXn adjacent in the second direction DR2, and the electrode branch portions RM_B1 and RM_B2 of different second electrodes RME2 may be disposed in one sub-pixel SPXn. The first electrode branch portion RM_B1 of the second electrode RME2 may be disposed on the left side of the first electrode RME1, and the second electrode branch portion RM_B2 of another second electrode RME2 may be disposed on the right side of the first electrode RME1.

The electrode branch portions RM_B1 and RM_B2 of the second electrode RME2 may overlap one side of the second bank pattern BP2. The first electrode branch portion RM_B1 may partially overlap the second bank pattern BP2 disposed on the left side of the first bank pattern BP1, and the second electrode branch portion RM_B2 may partially overlap the second bank pattern BP2 disposed on the right side of the first bank pattern BP1. Both sides of the first electrode RME1 may face and be spaced apart from different electrode branch portions RM_B1 and RM_B2 of different second electrodes RME2, and the gap between the first electrode RME1 and each of the electrode branch portions RM_B1 and RM_B2 may be smaller than the gap between different bank patterns BP1 and BP2.

The width of the first electrode RME1 measured in the second direction DR2 may be greater than the widths of the electrode stem portion RM_S and the electrode branch portions RM_B1 and RM_B2 of the second electrode RME2. The first electrode RME1 may have a width greater than that of the first bank pattern BP1 and overlap both sides of the first bank pattern BP1, whereas the second electrode RME2 may have a relatively small width so that the electrode branch portions RM_B1 and RM_B2 may overlap only one side of the second bank pattern BP2.

The first electrode RME1 may contact the first conductive pattern CDP1 of the third conductive layer through the first electrode contact hole CTD at the portion overlapping the portion of the bank layer BNL extending in the second direction DR2. The second electrode RME2 may contact the second voltage line VL2 of the third conductive layer through the second electrode contact hole CTS at the electrode stem portion RM_S. The portion of the first electrode RME1 disposed in the sub-region SA may be disposed to overlap the first contact portion CT1. The second electrode RME2 may have a portion that protrudes from the electrode stem portion RM_S in the second direction DR2 to be disposed in the sub-region SA, and the second electrode RME2 may overlap the second contact portion CT2 at the protruding part.

Between the first electrode RME1 and the second electrode RME2, the first electrode RME1 may extend to separation portions ROP1 and ROP2 of the sub-region SA, whereas the second electrode RME2 may not be separated in the sub-region SA. One second electrode RME2 may include electrode stem portions RM_S and the electrode branch portions RM_B1 and RM_B2, and may have a shape extending in the first direction DR1 and branched near the emission area EMA of each sub-pixel SPXn. The first electrode RME1 may be disposed between the separation portions ROP1 and ROP2 disposed in different sub-regions SA1 and SA2 of each sub-pixel SPXn and may be disposed across the emission area EMA.

In accordance with one embodiment, the display device 10 may include a wire connection electrode EP disposed between the first electrodes RME1 of different sub-pixels SPXn in the first sub-region SA1 among the sub-regions SA1 and SA2 of each sub-pixel SPXn. The wire connection electrode EP may not be disposed in the second sub-region SA of the sub-pixel SPXn, and the first electrodes RME1 of different sub-pixels SPXn adjacent in the first direction DR1 may be spaced apart from each other. In the sub-pixel SPXn illustrated in FIG. 25 among the sub-pixels SPXn, the first sub-region SA1 in which the wire connection electrode EP is disposed may be disposed on the upper side of the emission area EMA, and the second sub-region SA2 may be disposed on the lower side of the emission area EMA. On the other hand, in the sub-pixel SPXn adjacent to the sub-pixel SPXn of FIG. 22 in the first direction DR1, the first sub-region SA1 in which the wire connection electrode EP is disposed may be disposed on the lower side of the emission area EMA, and the second sub-region SA2 may be disposed on the upper side of the emission area EMA.

The first electrode RME1 may be spaced apart from the wire connection electrode EP with the first separation part ROP1 interposed therebetween in the first sub-region SA1. Two first separation portions ROP1 may be disposed in one first sub-region SA1. The wire connection electrode EP may be spaced apart from the first electrode RME1 disposed in the corresponding sub-pixel SPXn with a lower first separation portion ROP1 interposed therebetween, and may be spaced apart from the first electrode RME1 disposed in another sub-pixel SPXn with an upper first separation portion ROP1 interposed therebetween. One second separation portion ROP2 may be disposed in the second sub-region SA2, and different first electrodes RME1 may be spaced apart from each other in the first direction DR1.

In one embodiment, the wire connection electrode EP may be connected to the first voltage line VL1 of the third conductive layer through the third electrode contact hole CTA penetrating the via layer VIA. The first electrode RME1 may be connected to the wire connection electrode EP, and the electric signal applied to arrange the light emitting elements ED may be applied from the first voltage line VL1 to the first electrode RME1 through the wire connection electrode EP. In the process of arranging the light emitting elements ED, signals may be applied to the first voltage line VL1 and the second voltage line VL2, and may be transmitted to the first electrode RME1 and the second electrode RME2.

A relative arrangement of the second electrode contact hole CTS may be different from that of the third electrode contact hole CTA to be described later. The second electrode contact hole CTS may be disposed at the portion of the bank layer BNL surrounding the second sub-region SA2, and the third electrode contact hole CTA may be disposed in the first sub-region SA1. Since the second electrode contact hole CTS and the third electrode contact hole CTA expose the top surfaces of different voltage lines VL1 and VL2, respectively, the positions of the electrode contact holes may be determined to correspond thereto.

The bank layer BNL may surround the emission area EMA and the sub-regions SA1 and SA2 similarly to the above-described embodiment. However, in the embodiment in which the display device 10 includes the sub-regions SA1 and SA2 distinguished from each other, the areas surrounded by the bank layer BNL may be distinguished from each other. The bank layer BNL may be the same as that in the above-described embodiment except that it surrounds different sub-regions SA1 and SA2.

The light emitting elements ED may be disposed on different electrodes RME between different bank patterns BP1 and BP2. The light emitting element ED may include the first light emitting element EL1 having both ends disposed on the first electrode RME1 and the second electrode branch portion RM_B2 of the second electrode RME2, and the second light emitting element ED2 having both ends disposed on the first electrode RME1 and the first electrode branch portion RM_B1 of another second electrode RME2. The first light emitting elements ED1 may be disposed on the right side with respect to the first electrode RME1, and the second light emitting elements ED2 may be disposed on the left side with respect to the first electrode RME1. The first light emitting elements ED1 may be disposed on the first electrode RME1 and the second electrode RME2, and the second light emitting elements ED2 may be disposed on the first electrode RME1 and the second electrode RME2.

The connection electrodes CNE (CNE1, CNE2, and CNE3) may include a first connection electrode CNE1, a second connection electrode CNE2, and a third connection electrode CNE3.

The first connection electrode CNE1 may have a shape extending in the first direction DR1 and may be disposed on the first electrode RME1. A portion of the first connection electrode CNE1 disposed on the first bank pattern BP1 may overlap the first electrode RME1, and may extend therefrom in the first direction DR1 to be disposed in the first sub-region SA1 located on the upper side of the emission area EMA over the bank layer BNL. The first connection electrode CNE1 may contact the first electrode RME1 through the first contact portion CT1 in the first sub-region SA1.

The second connection electrode CNE2 may have a shape extending in the first direction DR1 and may be disposed on the second electrode RME2. A portion of the second connection electrode CNE2 disposed on the second bank pattern BP2 may overlap the second electrode RME2, and may extend therefrom in the first direction DR1 to be disposed in the first sub-region SA1 located on the upper side of the emission area EMA over the bank layer BNL. The second connection electrode CNE2 may contact the second electrode RME2 through the second contact portion CT2 in the first sub-region SA1.

In the sub-pixel SPXn adjacent to the sub-pixel SPXn of FIG. 22 in the first direction DR1, the first connection electrode CNE1 and the second connection electrode CNE2 may contact the first electrode RME1 and the second electrode RME2 through the contact portions CT1 and CT2 disposed in the second sub-region SA2, respectively.

The third connection electrode CNE3 may include the extension portions CN_E1 and CN_E2 extending in the first direction DR1 and a first connection portion CN_B1 connecting the extension portions CN_E1 and CN_E2. The first extension portion CN_E1 may be disposed on the second electrode branch portion RM_B2 of the second electrode RME2 while facing the first connection electrode CNE1 in the emission area EMA, and the second extension portion CN_E2 may be disposed on the first electrode RME1 while facing the second connection electrode CNE2 in the emission area EMA. The first connection portion CN_B1 may extend in the second direction DR2 on the bank layer BNL disposed on the lower side of the emission area EMA to connect the first extension portion CN_E1 to the second extension portion CN_E2. The third connection electrode CNE3 may be disposed on the emission area EMA and the bank layer BNL, and may not be directly connected to the electrode RME. The second electrode branch portion RM_B2 disposed under the first extension portion CN_E1 may be electrically connected to the second voltage line VL2, and the second power voltage applied to the second electrode branch portion RM_B2 may not be transmitted to the third connection electrode CNE3.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. A display device comprising:

a display area and a pad area disposed on a side of the display area; and conductive layers comprising wires and conductive patterns disposed in the display area and the pad area on a substrate, wherein at least one of the conductive layers comprises a copper-indium alloy and comprises a metal layer having a grain size equal to or less than about 140 nm.

2. The display device of claim 1, wherein the metal layer has a resistivity equal to or less than about 2.3 μΩcm.

3. The display device of claim 1, wherein the metal layer has an indium content equal to or less than about 1 at %.

4. The display device of claim 3, wherein the metal layer has an indium content equal to or less than about 0.4 at %.

5. The display device of claim 1, wherein the metal layer has a thickness in a range of about 2,000 Å to about 20,000 Å.

6. The display device of claim 5, wherein the metal layer has a thickness in a range of about 7,500 Å to about 8,500 Å, and a sheet resistance value in a range of 0.02 about Ω/□ to about 0.03 Ω/□.

7. The display device of claim 5, wherein the metal layer has a thickness in a range of about 2,500 Å to about 3,500 Å, and a sheet resistance value in a range of about 0.06 Ω/□ to about 0.08 Ω/□.

8. The display device of claim 1, wherein the metal layer has a line edge roughness equal to or less than about 0.195 μm.

9. The display device of claim 1, further comprising:

a via layer disposed on the conductive layers in the display area, wherein the conductive layers comprises:

a first conductive layer comprising a lower metal layer disposed in the display area and a first pad wire disposed in the pad area;

a second conductive layer comprising gate electrodes disposed in the display area on the first conductive layer and a second pad wire disposed in the pad area; and a third conductive layer comprising a first conductive pattern disposed in the display area on the second conductive layer and a pad electrode lower layer disposed in the pad area, and the display device further comprising:

a pad electrode upper layer disposed on the pad electrode lower layer in the pad area; and a pad electrode capping layer disposed on the pad electrode upper layer.

10. The display device of claim 9, further comprising:

a first gate insulating layer disposed between the first conductive layer and the second conductive layer;

a first interlayer insulating layer disposed between the second conductive layer and the third conductive layer; and a first passivation layer disposed on the third conductive layer, wherein each of the first gate insulating layer, the first interlayer insulating layer, and the first passivation layer contains an inorganic insulating material.

11. The display device of claim 10, wherein the conductive layer further comprises a fourth conductive layer disposed on the third conductive layer and comprising a first voltage line and a second voltage line, and the display device further comprises:

a second interlayer insulating layer disposed on the first passivation layer; and a second passivation layer disposed on the fourth conductive layer.

12. The display device of claim 11, further comprising:

a first electrode and a second electrode disposed on the via layer in the display area and spaced apart from each other;

a first insulating layer disposed on the first electrode and the second electrode;

light emitting elements disposed on the first electrode and the second electrode spaced apart from each other on the first insulating layer;

a first connection electrode disposed on the first electrode and electrically contacting the light emitting element; and a second connection electrode disposed on the second electrode and electrically contacting the light emitting element, wherein the via layer comprises a trench exposing a portion of a top surface of the second passivation layer, at least a portion of the first electrode and the second electrode is disposed directly on the second passivation layer in the trench, and the light emitting elements are disposed in the trench.

13. The display device of claim 12, wherein the pad electrode upper layer, the first electrode, and the second electrode contain a same material, and the pad electrode capping layer, the first connection electrode, the second connection electrode contain a same material.

14. A wiring substrate comprising:

conductive layers comprising wires and conductive patterns disposed on a substrate; and at least one insulating layer disposed between the conductive layers, wherein at least one of the conductive layers contains a copper-indium alloy, and comprises a metal layer having a grain size equal to or less than about 140 nm and a resistivity equal to or less than about 2.3 μΩcm.

15. The wiring substrate of claim 14, wherein the metal layer has an indium content equal to or less than about 1 at %.

16. The wiring substrate of claim 15, wherein the metal layer has an indium content equal to or less than about 0.4 at %.

17. The wiring substrate of claim 14, wherein the metal layer has a thickness in a range of about 2,000 Å to about 20,000 Å.

18. The wiring substrate of claim 17, wherein the metal layer has a thickness in a range of about 7,500 Å to about 8,500 Å, and a sheet resistance value in a range of about 0.02 Ω/□ to about 0.03 Ω/□.

19. The wiring substrate of claim 17, wherein the metal layer has a thickness in a range of about 2,500 Å to about 3,500 Å, and a sheet resistance value in a range of about 0.06 Ω/□ to about 0.08 Ω/□.

20. The wiring substrate of claim 14, wherein the metal layer has a line edge roughness equal to or less than about 0.195 μm.

* * * * *